US012664061B2

(12) United States Patent
Jang et al.

(10) Patent No.: US 12,664,061 B2
(45) Date of Patent: Jun. 23, 2026

(54) MEMORY DEVICE AND OPERATING METHOD THEREOF

(71) Applicant: SAMSUNG ELECTRONICS CO., LTD., Suwon-si (KR)

(72) Inventors: Wonyoung Jang, Suwon-si (KR); Taewon Kim, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 85 days.

(21) Appl. No.: 18/904,702

(22) Filed: Oct. 2, 2024

(65) Prior Publication Data

US 2025/0226042 A1 Jul. 10, 2025

(30) Foreign Application Priority Data

Jan. 4, 2024 (KR) ........................ 10-2024-0001779

(51) Int. Cl.
*G06F 11/00* (2006.01)
*G06F 11/07* (2006.01)
*G06F 11/16* (2006.01)
*G06F 11/20* (2006.01)
*G11C 29/00* (2006.01)
*G11C 29/18* (2006.01)

(52) U.S. Cl.
CPC ........ *G06F 11/1666* (2013.01); *G06F 11/073* (2013.01); *G06F 11/0793* (2013.01); *G06F 11/16* (2013.01); *G06F 11/1612* (2013.01); *G06F 11/2094* (2013.01); *G11C 29/70* (2013.01); *G11C 2029/1802* (2013.01); *G11C 29/76* (2013.01)

(58) Field of Classification Search
CPC .... G06F 11/073; G06F 11/0793; G06F 11/16; G06F 11/1612; G06F 11/1666; G06F 11/2094; G11C 29/70
See application file for complete search history.

(56) References Cited

U.S. PATENT DOCUMENTS

| | | | |
|---|---|---|---|
| 7,254,076 B2 | 8/2007 | Chae et al. | |
| 7,336,549 B2 | 2/2008 | Min et al. | |
| 8,315,116 B2 | 11/2012 | Kim et al. | |
| (Continued) | | | |

FOREIGN PATENT DOCUMENTS

| | | |
|---|---|---|
| KR | 10-0689706 B1 | 3/2007 |
| KR | 10-0724333 B1 | 6/2007 |
| (Continued) | | |

*Primary Examiner* — Joshua P Lottich
(74) *Attorney, Agent, or Firm* — Sughrue Mion, PLLC

(57) ABSTRACT

A memory device includes a row decoder including a plurality of row decoder blocks arranged in series, wherein the plurality of row decoder blocks are distinguished based on row addresses which the plurality of row decoder blocks take charge of; a repair address storage circuit including a fuse array in which a first plurality of faulty row addresses are stored; a repair control circuit including a plurality of repair control blocks arranged in series to correspond to the plurality of row decoder blocks; and a fuse tracking circuit configured to determine locations of row decoder blocks corresponding to a second plurality of faulty row addresses among the first plurality of faulty row addresses received from the repair address storage circuit and to control an operation of the row decoder based on the locations.

20 Claims, 15 Drawing Sheets

100B

(56) References Cited

U.S. PATENT DOCUMENTS

| | | | |
|---|---|---|---|
| 8,686,786 B2 | 4/2014 | Park et al. | |
| 9,142,325 B2 | 9/2015 | Lee et al. | |
| 9,401,227 B2 | 7/2016 | Noh | |
| 2002/0003279 A1* | 1/2002 | Lee | G11C 29/70 |
| | | | 257/529 |
| 2006/0092725 A1 | 5/2006 | Min et al. | |
| 2006/0239090 A1* | 10/2006 | Anazawa | G11C 29/4401 |
| | | | 365/200 |
| 2007/0076497 A1 | 4/2007 | Chae et al. | |
| 2008/0181035 A1* | 7/2008 | Kawasumi | G11C 29/44 |
| | | | 365/225.7 |
| 2011/0267908 A1 | 11/2011 | Kim et al. | |
| 2013/0257520 A1 | 10/2013 | Park et al. | |
| 2015/0049546 A1 | 2/2015 | Choi | |
| 2015/0098286 A1 | 4/2015 | Lee et al. | |
| 2016/0180969 A1 | 6/2016 | Noh | |
| 2017/0169905 A1* | 6/2017 | Walton | G06F 3/0656 |
| 2017/0269989 A1* | 9/2017 | Kim | G06F 11/073 |
| 2019/0198090 A1* | 6/2019 | Lee | G11C 29/70 |
| 2019/0287641 A1* | 9/2019 | Ko | G11C 29/4401 |
| 2021/0026728 A1* | 1/2021 | Kim | G06F 11/0793 |
| 2021/0064462 A1* | 3/2021 | Eun | G11C 11/40615 |
| 2021/0110881 A1* | 4/2021 | Eichmeyer | G11C 29/808 |
| 2022/0208295 A1* | 6/2022 | Chueh | G11C 29/4401 |
| 2023/0111467 A1* | 4/2023 | Cho | G11C 29/783 |
| | | | 365/185.09 |
| 2023/0377672 A1* | 11/2023 | Cho | G11C 29/42 |
| 2024/0385754 A1* | 11/2024 | Wu | G06F 11/073 |
| 2025/0087296 A1* | 3/2025 | Chen | G11C 29/785 |
| 2025/0131973 A1* | 4/2025 | Lu | G11C 29/52 |

FOREIGN PATENT DOCUMENTS

| | | |
|---|---|---|
| KR | 10-1131557 B1 | 4/2012 |
| KR | 10-2015-0019442 A | 2/2015 |
| KR | 10-2015-0041330 A | 4/2015 |
| KR | 10-2014-0183247 A | 6/2016 |
| KR | 10-1878903 B1 | 7/2018 |

* cited by examiner

| | L0 | L1 | L2 | | L12 | L13 | | L37 | L38 | R0 | R1 | | R34 | R35 | R36 | R37 | R38 |
|---|---|---|---|---|---|---|---|---|---|---|---|---|---|---|---|---|---|
| RA16 | 0 | 0 | 0 | ⋮ | 0 | 0 | ⋮ | 0 | 0 | 0 | 0 | ⋯ | 1 | 1 | 1 | 1 | 1 |
| RA15 | 0 | 0 | 0 | | 0 | 0 | | 1 | 1 | 1 | 1 | | 0 | 0 | 0 | 0 | 0 |
| RA14 | 0 | 0 | 0 | | 0 | 1 | | 0 | 0 | 1 | 1 | | 1 | 1 | 1 | 1 | 1 |

Left 39 BLKs                Right 39 BLKs

| | BLK 0 | BLK 1 | BLK 2 | ⋮ | BLK 12 | BLK 13 | ⋮ | BLK 24 | BLK 25 | BLK 26 | BLK 27 | ⋮ | BLK 73 | BLK 74 | BLK 75 | BLK 76 | BLK 77 |
|---|---|---|---|---|---|---|---|---|---|---|---|---|---|---|---|---|---|
| RA16 | 0 | 0 | 0 | | 0 | 0 | | 0 | 0 | 0 | 0 | | 1 | 1 | 1 | 1 | 1 |
| RA15 | 0 | 0 | 0 | | 0 | 0 | | 0 | 0 | 1 | 1 | | 0 | 0 | 0 | 0 | 0 |
| RA14 | 0 | 0 | 0 | | 0 | 1 | | 1 | 1 | 0 | 0 | | 1 | 1 | 1 | 1 | 1 |

• • • • •

MEMORY DEVICE AND OPERATING METHOD THEREOF

CROSS-REFERENCE TO RELATED APPLICATIONS

This application claims priority under 35 U.S.C. § 119 to Korean Patent Application No. 10-2024-0001779 filed on Jan. 4, 2024, in the Korean Intellectual Property Office, the disclosures of which are incorporated by reference herein in their entireties.

BACKGROUND

Embodiments of the present disclosure described herein relate to a memory device and an operating method thereof.

A memory device is used to store data and is classified as a volatile memory device or a nonvolatile memory device. The volatile memory device refers to a memory device which loses data stored therein when a power is turned off. The volatile memory device includes a static random access memory (SRAM), a dynamic RAM (DRAM), a synchronous DRAM, etc.

The memory device may store faulty address information about a faulty memory cell(s) detected in the process of testing the memory device. The memory device may perform a repair operation of replacing faulty memory cells with redundancy memory cells by using the stored faulty address information. Accordingly, the memory device may function as a normal product even though faulty memory cells are present in the memory device. This may mean that the memory device yield increases.

SUMMARY

Embodiments of the present disclosure provide a memory device which may have improved performance by utilizing faulty address information stored for a repair operation, and an operating method thereof.

According to an aspect of an example embodiment, a memory device includes: a row decoder including a plurality of row decoder blocks arranged in series, wherein the plurality of row decoder blocks are distinguished based on row addresses which the plurality of row decoder blocks take charge of; a repair address storage circuit including a fuse array in which a first plurality of faulty row addresses are stored; a repair control circuit including a plurality of repair control blocks arranged in series to correspond to the plurality of row decoder blocks; and a fuse tracking circuit configured to determine locations of row decoder blocks corresponding to a second plurality of faulty row addresses among the first plurality of faulty row addresses received from the repair address storage circuit and to control an operation of the row decoder based on the locations.

According to an aspect of an example embodiment, a method of a memory device which includes a plurality of row decoder blocks distinguished based on row addresses which the plurality of row decoder blocks take charge of, includes: based on the memory device being turned on, storing a first plurality of faulty row addresses in a plurality of repair control blocks, respectively; based on the memory device being turned on, determining locations of row decoder blocks corresponding to a second plurality of faulty row addresses among the first plurality of faulty row addresses; and generating a control signal for controlling an operation of the memory device based on the locations, wherein the second plurality of faulty row addresses includes a third plurality of faulty row addresses stored in a given number of repair control blocks continuously disposed from one side of the plurality of repair control blocks.

According to an aspect of an example embodiment, a memory device includes: a fuse array configured to store a faulty row address; a plurality of row decoder blocks respectively corresponding to a plurality of memory cell blocks; and a fuse tracking circuit configured to determine a location of a row decoder block corresponding to the faulty row address from among the plurality of row decoder blocks and to generate a control signal for controlling an operation of the memory device based on the location.

BRIEF DESCRIPTION OF THE DRAWINGS

The above and other objects and features of the present disclosure will become apparent by describing in detail embodiments thereof with reference to the accompanying drawings, in which:

FIG. 6 is a diagram partially illustrating address coding of a plurality of row decoder blocks according to an embodiment of the present disclosure;

FIG. 10A is a diagram for describing a method of adjusting a delay amount of an active master signal according to an embodiment of the present disclosure;

DETAILED DESCRIPTION

Hereinafter, various embodiments of the present disclosure will be described in detail with reference to the accompanying drawings to such an extent that one skilled in the art to which the present disclosure belongs may easily carry the present disclosure.

In the present disclosure, the expressions "first", "second", etc. may modify various components regardless of the order and/or the importance, are only used to distinguish one component from another component, and are not intended to limit the order or importance of components.

Figure 1:
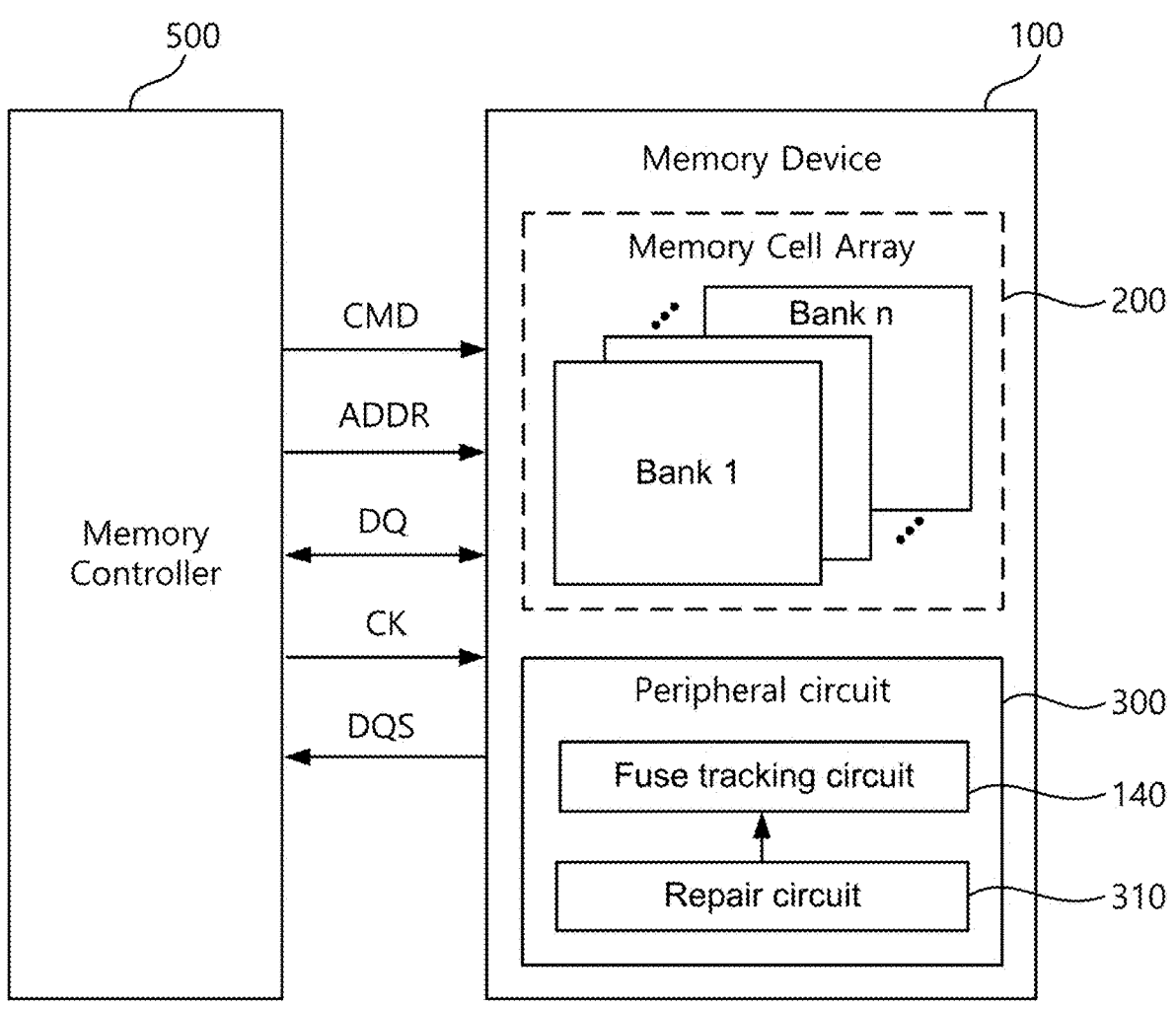
FIG. 1 is a block diagram illustrating a configuration of a memory system according to an embodiment of the present disclosure.

FIG. 1 is a block diagram illustrating a configuration of a memory system according to an embodiment of the present disclosure.

Referring to FIG. 1, a memory system 1000 may include a memory controller 500 and a memory device 100.

The memory controller 500 may control the memory device 100. For example, the memory controller 500 may control the memory device 100 depending on a request of a processor supporting various applications such as a server application, a personal computer (PC) application, and a mobile application. For example, the memory controller 500 may be included in a host including a processor and may control the memory device 100 depending on a request of the processor.

To control the memory device 100, the memory controller 500 may transmit a clock signal CK, a command CMD, and/or an address ADDR to the memory device 100. Also, the memory controller 500 may transmit a data signal DQ to the memory device 100 or may receive the data signal DQ from the memory device 100. When the memory controller 500 reads the data signal DQ from the memory device 100, the memory controller 500 may receive a data strobe signal DQS from the memory device 100.

The memory device 100 may receive data from the memory controller 500 and may store the received data. The memory device 100 may read the stored data in response to a request of the memory controller 500 and may transmit the read data to the memory controller 500.

In an embodiment, the memory device 100 may be a memory device including volatile memory cells. For example, the memory device 100 may include various dynamic random access memory (DRAM) devices such as a double data rate synchronous DRAM (DDR SDRAM), a DDR2 SDRAM, a DDR3 SDRAM, a DDR4 SDRAM, a DDR5 SDRAM, a DDR6 SDRAM, a low power double data rate (LPDDR) SDRAM, an LPDDR2 SDRAM, an LPDDR3 SDRAM, an LPDDR4 SDRAM, an LPDDR4X SDRAM, an LPDDR5 SDRAM, a graphics double data rate synchronous graphics random access memory (GDDR SGRAM), a GDDR2 SGRAM, a GDDR3 SGRAM, a GDDR4 SGRAM, a GDDR5 SGRAM, and a GDDR6 SGRAM.

Also, in an embodiment, the memory device 100 may be implemented with a memory device, in which DRAM dies are stacked, such as a high bandwidth memory (HBM), an HBM2, or an HBM3. Also, the memory device 100 may be a processor in memory (PIM). Also, according to an embodiment, the memory device 100 may be a memory module such as a dual in-line memory module (DIMM). For example, the memory device 100 may be a registered DIMM (RDIMM), a load reduced DIMM (LRDIMM), an unbuffered DIMM (UDIMM), a fully buffered DIMM (FB-DIMM), or a small outline DIMM (SO-DIMM). However, this is provided as an example, and the memory device 100 may be any other memory module such as a single in-line memory module (SIMM). Also, in an embodiment, the memory device 100 may include an SRAM device, a NAND flash memory device, a NOR flash memory device, an RRAM device, an FRAM device, a PRAM device, a TRAM device, an MRAM device, etc.

The memory device 100 may include a memory cell array 200 and a peripheral circuit 300.

The memory cell array 200 may include a plurality of banks Bank 1 to Bank n. Each of the banks Bank 1 to Bank n may include a plurality of memory cells for storing data. Below, it is assumed that each bank includes DRAM cells. However, this is provided as an example, and each of the plurality of banks Bank 1 to Bank n may be implemented to include any other volatile memory cells in addition to the DRAM cells. Also, the plurality of banks Bank 1 to Bank n may be implemented to include the same kind of memory cells or may be implemented to include different kinds of memory cells.

The plurality of memory cells included in each of the banks Bank 1 to Bank n may be disposed at intersections of a plurality of rows and a plurality of columns to constitute an array in the form of a matrix. Accordingly, each of the banks Bank 1 to Bank n may include a plurality of cell rows or a plurality of cell columns. In this case, memory cells belonging to the same cell row may be connected to the same word line, and memory cells belonging to the same cell column may be connected to the same bit line. However, the present disclosure is not limited thereto.

The plurality of memory cells included in each of the banks Bank 1 to Bank n may include normal memory cells and/or redundancy memory cells. The redundancy memory cell may be a memory cell for repairing a normal memory cell (i.e., a faulty memory cell) which is defective.

The peripheral circuit 300 may include both various analog circuits and various digital circuits which are necessary to store data in the memory cell array 200 or to read data stored in the memory cell array 200. For example, the peripheral circuit 300 may include a bit line sense amplifier, a sub-word line driver, a row decoder (or X-decoder), a column decoder (or Y-decoder), a command decoder, an address register, an address latch, a delay locked loop (DLL), an input/output circuit, a power circuit (i.e., DC circuit), etc.

Also, the peripheral circuit 300 may include a repair circuit 310 and a fuse tracking circuit 140. According to an embodiment, the repair circuit 310 and the fuse tracking circuit 140 may be provided for each of the plurality of banks Bank 1 to Bank n, but the present disclosure is not limited thereto.

The repair circuit 310 may store repair information. The repair information may include faulty address information about a faulty memory cell(s) detected through the test in the process of manufacturing the memory device 100. For example, the repair information may include a faulty row address (FRA). The faulty row address may be an address of a word line corresponding to a normal cell row including a faulty memory cell.

The repair circuit 310 may generate a control signal for the repair operation based on the stored repair information. The repair operation may refer to an operation of replacing a faulty memory cell with a redundancy memory cell. For example, the repair circuit 310 may compare a row address applied to the row decoder with the stored faulty row address. When the row address applied to the row decoder coincides with the stored faulty row address, the repair circuit 310 may generate the control signal for the repair operation and may output the control signal to the row decoder.

When the control signal for the repair operation is received from the repair circuit 310, the row decoder may select or activate a word line corresponding to a redundancy row address, instead of a word line corresponding to the applied row address. Herein, the redundancy row address may be an address of a word line corresponding to a redundancy cell row. According to the above description, the repair operation may be performed in units of cell row.

The fuse tracking circuit 140 may control the operation of the memory device 100 by using the repair information stored in the repair circuit 310.

For example, based on the faulty row address stored in the repair circuit 310, the fuse tracking circuit 140 may determine a location of a row decoder block corresponding to the faulty row address from among a plurality of row decoder blocks constituting the row decoder. Also, the fuse tracking circuit 140 may control the operation of the row decoder, based on the location of the row decoder block corresponding to the determined faulty row address. In an embodiment, the fuse tracking circuit 140 may determine flexibility or may adjust a delay amount of an active master signal. The row decoder may operate based on the determined flexibility and/or the adjusted delay amount of the active master signal.

The flexibility may indicate a range of row decoder blocks which each repair control block included in the repair circuit 310 takes charge of and may be associated with power consumption of the repair circuit 310. Also, the delay amount of the active master signal may be associated with the RAS to CAS delay (tRCD) margin. Accordingly, according to embodiments of the present disclosure, the performance of the memory device 100 may be improved by determining the flexibility or adjusting the delay amount of the active master signal by utilizing faulty address information to be used in the repair operation.

Figure 2:
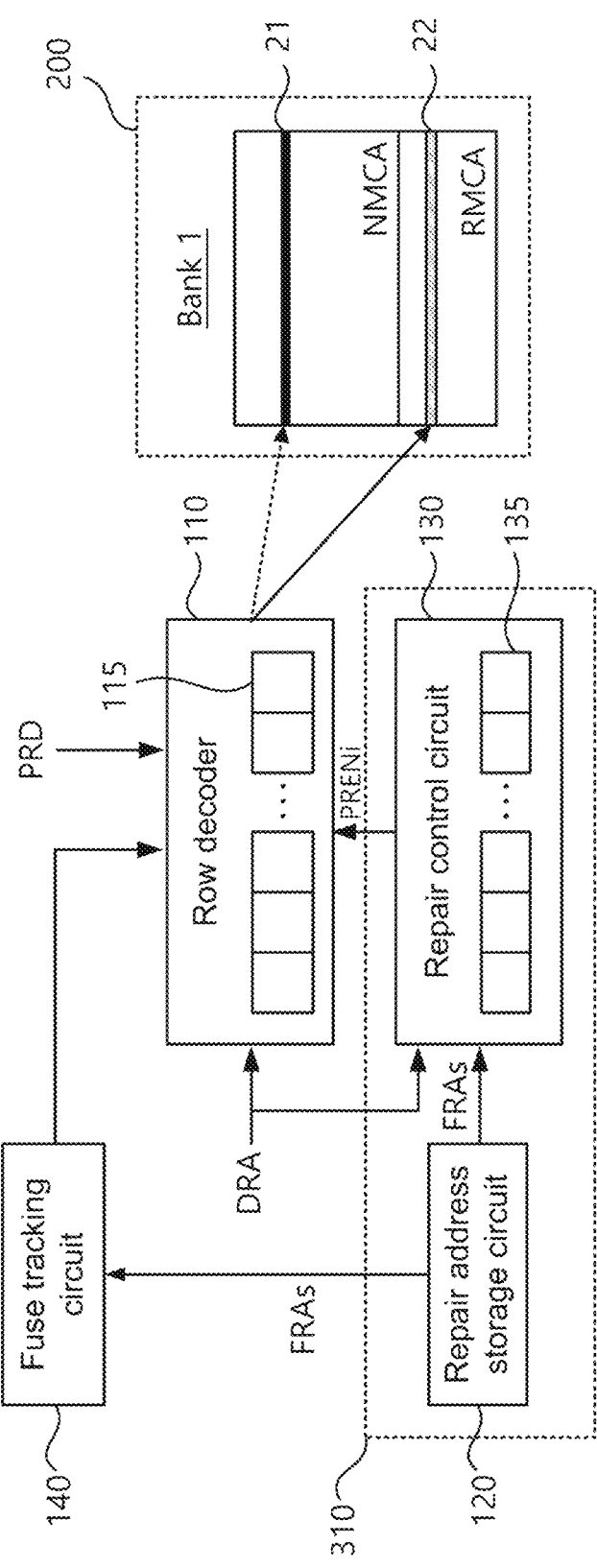
FIG. 2 is a block diagram illustrating a configuration of a memory device according to an embodiment of the present disclosure.

FIG. 2 is a block diagram illustrating a configuration of a memory device according to an embodiment of the present disclosure. A memory device 100A of FIG. 2 may be an embodiment of the memory device 100 of FIG. 1, but the present disclosure is not limited thereto.

Referring to FIG. 2, the memory device 100A may include a row decoder 110, a repair address storage circuit 120, a repair control circuit 130, and the fuse tracking circuit 140.

When the active operation is initiated, the row decoder 110 may receive a row address DRA. In this case, the row address DRA may correspond to a specific word line 21 included in a normal memory cell array NMCA of one bank (e.g., Bank 1) selected from the plurality of banks Bank 1 to Bank n.

When the active operation is initiated and a given delay time passes, the row decoder 110 may receive an active master signal PRD. The row decoder 110 may select or activate the word line 21 corresponding to the row address DRA in response to the active master signal PRD. For example, when a control signal PRENi for the repair operation is not received from the repair control circuit 130 until the active master signal PRD is received, the row decoder 110 may select or activate the word line 21 corresponding to the row address DRA in response to the active master signal PRD.

The row decoder 110 may perform the repair operation in response to the control signal PRENi for the repair operation. In an embodiment, the repair operation may refer to an operation of selecting or activating a word line 22 corresponding to a redundancy row address, instead of the word line 21 corresponding to the row address DRA. The word line 22 may be a word line included in a redundancy memory cell array RMCA of Bank 1. For example, after the active operation is initiated and before the active master signal PRD is received, the row decoder 110 may receive the control signal PRENi for the repair operation from the repair control circuit 130. In this case, the row decoder 110 may perform the repair operation in response to the control signal PRENi for the repair operation.

The row decoder 110 may include a plurality of row decoder blocks 115 which are distinguished based on row addresses which the plurality of row decoder blocks 115 take charge of. When the row address DRA is applied, first, a row decoder block taking charge of the applied row address DRA from among the plurality of row decoder blocks 115 may be selected. Afterwards, the word line 21 corresponding to the applied row address DRA may be selected by the selected row decoder block. As described above, in some cases, a row decoder block taking charge of redundancy row addresses may select the word line 22 instead of the word line 21.

The repair address storage circuit 120 may store repair information. In an embodiment, the repair information may include a plurality of faulty row addresses FRAs. According to an embodiment, the repair address storage circuit 120 may include a fuse array. The fuse array may include laser fuses whose connections are controlled by laser irradiation. Alternatively, the fuse array may include electrical fuses whose connections are controlled by electrical signals. In an embodiment, the fuse array may include anti-fuses. A state of the anti-fuse is changed from a high resistance state to a low resistance state by an electrical signal (e.g., a high-voltage signal). The plurality of faulty row addresses FRAs may be detected in the test process before/after the packaging of the memory device 100A and may be stored in the fuse array. However, the present disclosure is not limited thereto.

The plurality of faulty row addresses FRAs stored in the repair address storage circuit 120 may be provided to the repair control circuit 130 and the fuse tracking circuit 140 in response to that the memory device 100A is turned on.

The repair control circuit 130 may determine whether the row address DRA applied to the row decoder 110 corresponds to the faulty row address FRA; when it is determined that the row address DRA corresponds to the faulty row address FRA, the repair control circuit 130 may generate the control signal PRENi for the repair operation and may provide the control signal PRENi to the row decoder 110.

To this end, the repair control circuit 130 may include a plurality of repair control blocks 135. In response to that the memory device 100A is turned on, the repair control circuit 130 may receive the plurality of faulty row addresses FRAs from the repair address storage circuit 120 and may sequentially store the plurality of faulty row addresses FRAs in the plurality of repair control blocks 135, respectively.

When the active operation is initiated in a state where the plurality of faulty row addresses FRAs are respectively stored in the plurality of repair control blocks 135, the repair control circuit 130 may receive the row address DRA. In this case, each of the plurality of repair control blocks 135 may determine whether the stored faulty row address FRA coincides with the row address DRA. In an embodiment, each of the plurality of repair control blocks 135 may include a comparison circuit comparing bit values of the stored faulty row address FRA and the received row address DRA, a combinational logic circuit outputting the control signal PRENi for the repair operation based on an output of the comparison circuit, or the like, but example embodiments are not limited thereto. As a determination result, a repair control block in which the faulty row address FRA coinciding with the row address DRA is present may provide the control signal PRENi for the repair operation to the row decoder 110.

When the control signal PRENi for the repair operation is received, the row decoder 110 may perform the repair operation by selecting the word line 22 corresponding to a redundancy row address instead of the word line 21 corresponding to the row address DRA as described above.

The repair address storage circuit 120 and the repair control circuit 130 may constitute the repair circuit 310 described with reference to FIG. 1.

The fuse tracking circuit 140 may track a location of a row decoder block corresponding to the faulty row address FRA from among the plurality of row decoder blocks 115 and may control the operation of the memory device 100A based on the location of the tracked row decoder block.

For example, in response to that the memory device 100 is turned on, the fuse tracking circuit 140 may receive the plurality of faulty row addresses FRAs from the repair address storage circuit 120. Also, the fuse tracking circuit 140 may determine locations of row decoder blocks corresponding to some faulty row addresses among the plurality of faulty row addresses FRAs received from the repair address storage circuit 120. In an embodiment, the some faulty row addresses may be faulty row addresses stored in a given number of repair control blocks continuously disposed from one side of the plurality of repair control blocks 135. Also, the given number of the continuous repair control blocks may vary depending on an embodiment. This will be described in detail later.

The fuse tracking circuit 140 may control the operation of the row decoder 110 based on the determined locations of the row decoder blocks.

According to an embodiment, the fuse tracking circuit 140 may determine flexibility based on the determined locations of the row decoder blocks. The row decoder 110 may operate depending on the determined flexibility. Because the flexibility determines a range of repair control blocks which repair control blocks take charge of, a length of a path through which the row address DRA, the control signal PRENi, and a row decoder internal operation signal are transferred may vary depending on the flexibility. When the length of the path through which the row address DRA, the control signal PRENi, and the row decoder internal operation signal are transferred varies, the amount of current which is consumed while the row address DRA, the control signal PRENi, and the row decoder internal operation signal are transferred may vary. This may mean that the amount of current consumption of the memory device 100A may vary depending on the flexibility.

Also, according to an embodiment, the fuse tracking circuit 140 may adjust a delay amount of the active master signal PRD based on the determined locations of the row decoder blocks. The row decoder 110 may operate based on an active master signal rPRD (refer to FIG. 8) with the delay amount adjusted by the fuse tracking circuit 140. Because the delay amount of the active master signal PRD is associated with the tRCD margin, the tRCD margin may be secured by adjusting the delay amount of the active master signal PRD.

According to an embodiment, the fuse tracking circuit 140 may be implemented to perform all the above operations of determining the flexibility and adjusting the delay amount of the active master signal PRD.

As described above, according to embodiments of the present disclosure, based on faulty row addresses stored in the repair address storage circuit 120, the fuse tracking circuit 140 may determine the flexibility or may adjust the delay amount of the active master signal PRD. Accordingly, the performance of the memory device 100A may be improved.

Figure 3:
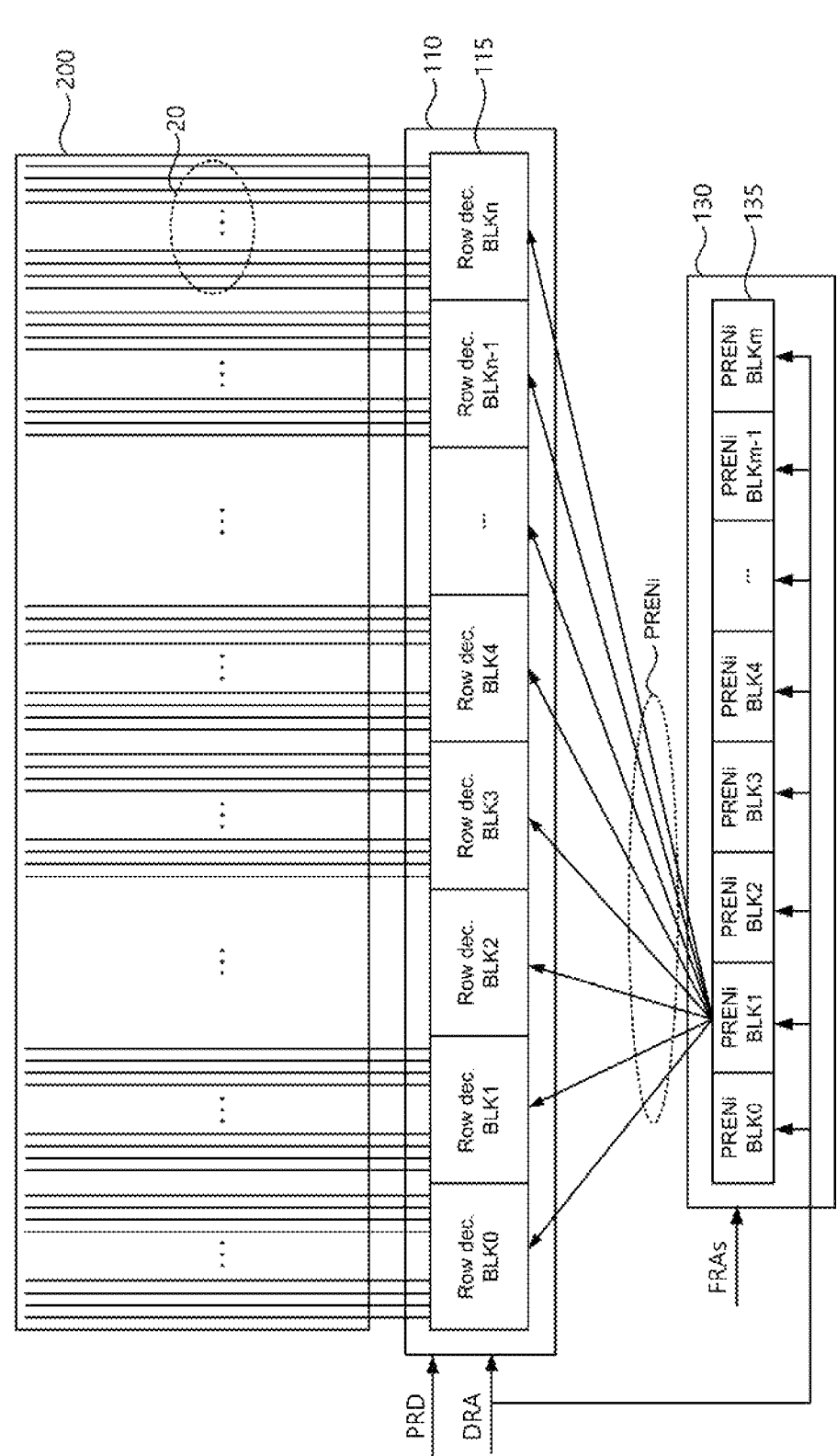
FIG. 3 is a diagram for describing configurations and operations of a row decoder and a repair control circuit according to an embodiment of the present disclosure.

FIG. 3 is a diagram for describing configurations and operations of a row decoder and a repair control circuit according to an embodiment of the present disclosure. Referring to FIG. 3, the row decoder 110 may include a plurality of row decoder blocks (Row dec. BLK0 to Row dec. BLKn) 115. The plurality of row decoder blocks 115 may be arranged in series to correspond to word lines 20 of the memory cell array 200. Each of the plurality of row decoder blocks 115 may be identified based on the word lines 20 which each row decoder block 115 takes charge of. Because a word line is identified by a row address, the plurality of row decoder blocks 115 may be distinguished based on row addresses which each row decoder block 115 takes charge of.

When the row address DRA is applied as the active operation is initiated, a row decoder block taking charge of the row address DRA from among the plurality of row decoder blocks 115 may be selected. In this case, the row decoder block taking charge of the row address DRA may not activate a word line corresponding to the row address DRA immediately, but the row decoder block may wait until the active master signal PRD is applied. After the active operation is initiated and a given delay time passes, the active master signal PRD may be applied to the row decoder 110. Within the give delay time, when the active master signal PRD is received in a state where the control signal PRENi for the repair operation is not received, the row decoder block taking charge of the row address DRA may activate the word line corresponding to the row address DRA.

Within the give delay time, when the control signal PRENi for the repair operation is received from the repair control circuit 130, the row decoder block taking charge of the row address DRA may not activate the word line corresponding to the row address DRA. Instead, a redundancy word line may be activated by the row decoder block taking charge of the redundancy row addresses. As described above, the repair operation may be performed.

The repair control circuit 130 may include the plurality of repair control blocks (PRENi BLK0 to PRENi BLKm) 135. The plurality of repair control blocks 135 may be arranged in series to correspond to the plurality of row decoder blocks 115 arranged in series.

When the memory device 100A is turned on, the repair control circuit 130 may sequentially receive the plurality of faulty row addresses FRAs from the repair address storage circuit 120. The plurality of faulty row addresses FRAs sequentially received may be sequentially stored in the plurality of repair control blocks 135, respectively.

When the active operation is initiated in a state where the plurality of faulty row addresses FRAs are respectively stored in the plurality of repair control blocks 135, the repair control circuit 130 may receive the row address DRA. The received row address DRA may be transferred to each of the plurality of repair control blocks 135. In this case, each of the repair control blocks 135 may determine whether the stored faulty row address FRA coincides with the transferred row address DRA. As a determination result, when a repair control block (in an example of FIG. 3, PRENi BLK1) in which the faulty row address FRA coinciding with the row address DRA is stored is present, the corresponding repair control block PRENi BLK1 may generate the control signal PRENi for the repair operation and may transfer the control signal PRENi to each of the plurality of row decoder blocks 115.

Referring to FIG. 3, the plurality of row decoder blocks 115 and the plurality of repair control blocks 135 may be arranged in the memory device 100A in a specific shape and thus may have a physical location relationship. Also, a path through which the row address DRA is applied to each repair control block or a path through which the control signal PRENi generated by a repair control block is transferred to each row decoder block may be formed of a physical line (or wire) with parasitic components (i.e., a parasitic resistance and a parasitic capacitance). Accordingly, a length of a path through which the control signal PRENi is transferred or a time necessary to generate and transfer the control signal PRENi may vary depending on a location of a repair control block and a location of a row decoder block.

The length of the path through which the control signal PRENi is transferred may be associated with the flexibility and may affect the amount of current consumption of the memory device 100A. Also, the time necessary to generate and transfer the control signal PRENi may be associated with setting the delay amount of the active master signal PRD and may affect tRCD of the memory device 100A.

According to embodiments of the present disclosure, the fuse tracking circuit 140 may determine locations of row decoder blocks corresponding to faulty row addresses stored in specific repair control blocks; based on the determined locations, the fuse tracking circuit 140 may determine the flexibility or may adjust the delay amount of the active master signal PRD. Accordingly, the performance of the memory device 100A may be improved.

Below, various embodiments of the present disclosure associated with determining the flexibility will be described in detail with reference to FIGS. 4 to 7.

Figure 4:
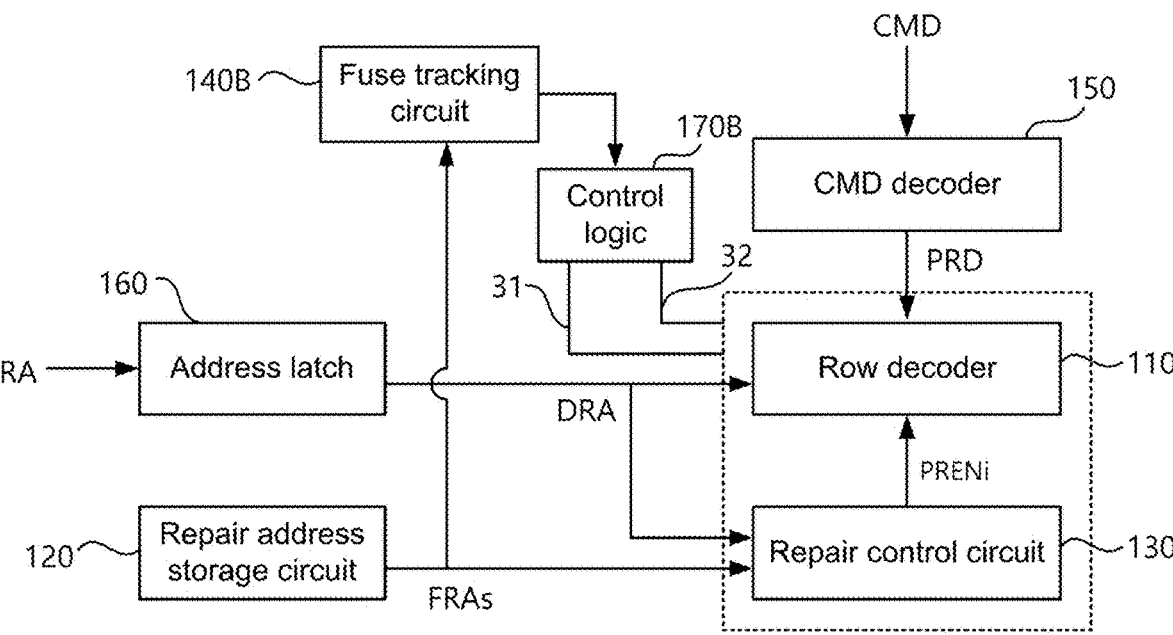
FIG. 4 is a block diagram illustrating a configuration of a memory device according to an embodiment of the present disclosure.

FIG. 4 is a block diagram illustrating a configuration of a memory device according to an embodiment of the present disclosure. A memory device 100B of FIG. 4 may be an embodiment of the memory devices 100 and 100A of FIGS. 1 to 3, but the present disclosure is not limited thereto. In describing FIG. 4, the description which is given above will be omitted or simplified.

Referring to FIG. 4, the memory device 100B may include the row decoder 110, the repair address storage circuit 120, the repair control circuit 130, a fuse tracking circuit 140B, a command decoder 150, an address latch 160, and control logic 170B.

The repair address storage circuit 120 may store the faulty row addresses FRAs. The faulty row addresses FRAs may be detected in the test process before/after the packaging of the memory device 100B and may be stored in the repair address storage circuit 120. However, the present disclosure is not limited thereto. When the memory device 100B is turned on, the faulty row addresses FRAs may be serially transferred to the repair control circuit 130 and may be sequentially stored in the plurality of repair control blocks 135 included in the repair control circuit 130, respectively.

Afterwards, when the active operation is initiated by the memory controller 500, the memory device 100B may receive the command CMD and the address ADDR from the memory controller 500.

The address ADDR may include a bank address, a row address RA, and a column address. The row address RA may be applied to the row decoder 110 and the repair control circuit 130 through the address latch 160.

In an embodiment, the row address RA input to the address latch 160 may indicate a row address before a bank is selected, and the row address RA which the address latch 160 outputs may indicate a row address for one bank selected from the plurality of banks Bank 1 to Bank n. Accordingly, it may be understood that the row decoder 110 and the repair control circuit 130 to which the row address DRA is applied are components corresponding to one bank. According to an embodiment of the present disclosure, the address latch 160, the row decoder 110, the repair control circuit 130, the fuse tracking circuit 140B, and the control logic 170B may be provided for each bank.

The command decoder 150 may decode the command CMD received from the memory controller 500 to generate the active master signal PRD. In this case, as described above, after a given delay time passes from a point in time when the command CMD is applied, the active master signal PRD may be applied to the row decoder 110.

As described above, when the applied row address DRA coincides with the stored faulty row address, the repair control circuit 130 may generate the control signal PRENi for the repair operation and may provide the control signal PRENi to the row decoder 110.

As described above, the row decoder 110 may select a word line corresponding to the row address DRA in response to the active master signal PRD or may perform the repair operation based on the control signal PRENi.

When the memory device 100B is turned on, the plurality of faulty row addresses FRAs stored in the repair address storage circuit 120 may be provided to the fuse tracking circuit 140 as well as the repair control circuit 130. The fuse tracking circuit 140B may determine locations of row decoder blocks corresponding to some faulty row addresses among the plurality of faulty row addresses FRAs received from the repair address storage circuit 120 and may output a control signal for determining the flexibility based on the determined locations.

In an embodiment, the flexibility may mean a range of row decoder blocks which each repair control block included in the repair control circuit 130 takes charge of. According to an embodiment of the present disclosure, the flexibility may include a full flexibility and a half flexibility. The full flexibility may correspond to the case where each repair control block included in the repair control circuit 130 takes charge of all the row decoder blocks 115 included in the row decoder 110. The half flexibility may correspond to the case where the one-side half of the plurality of repair control blocks 135 takes charge of the one-side half of the plurality of row decoder blocks 115 and the opposite-side half of the plurality of repair control blocks 135 takes charge of the opposite-side half of the plurality of row decoder blocks 115.

When the flexibility is determined, a range of row decoder blocks to which the control signal PRENi generated by each repair control block is transferred may be determined depending on the determined flexibility. Afterwards, the row decoder 110 and the repair control circuit 130 may operate depending on the determined flexibility. In detail, according to an embodiment of the present disclosure, the memory device 100B may include a first path 31 for operating with the full flexibility and a second path 32 for operating with the half flexibility. When the control signal for determining the flexibility is received from the fuse tracking circuit 140B, the control logic 170B may determine the flexibility by selecting one of the first path 31 and the second path 32 based on the received control signal. For example, when the control signal for determining the full flexibility is received, the control logic 170B may select the first path 31, and thus, the flexibility may be determined to be the full flexibility. In this case, the second path 32 not selected may be blocked. Also, when the control signal for determining the half flexibility is received, the control logic 170B may select the second path 32, and thus, the flexibility may be determined to be the half flexibility. In this case, the first path 31 not selected may be blocked. Afterwards, the row decoder 110 and the repair control circuit 130 may operate only through a path selected depending on the determined flexibility.

Figure 5A:
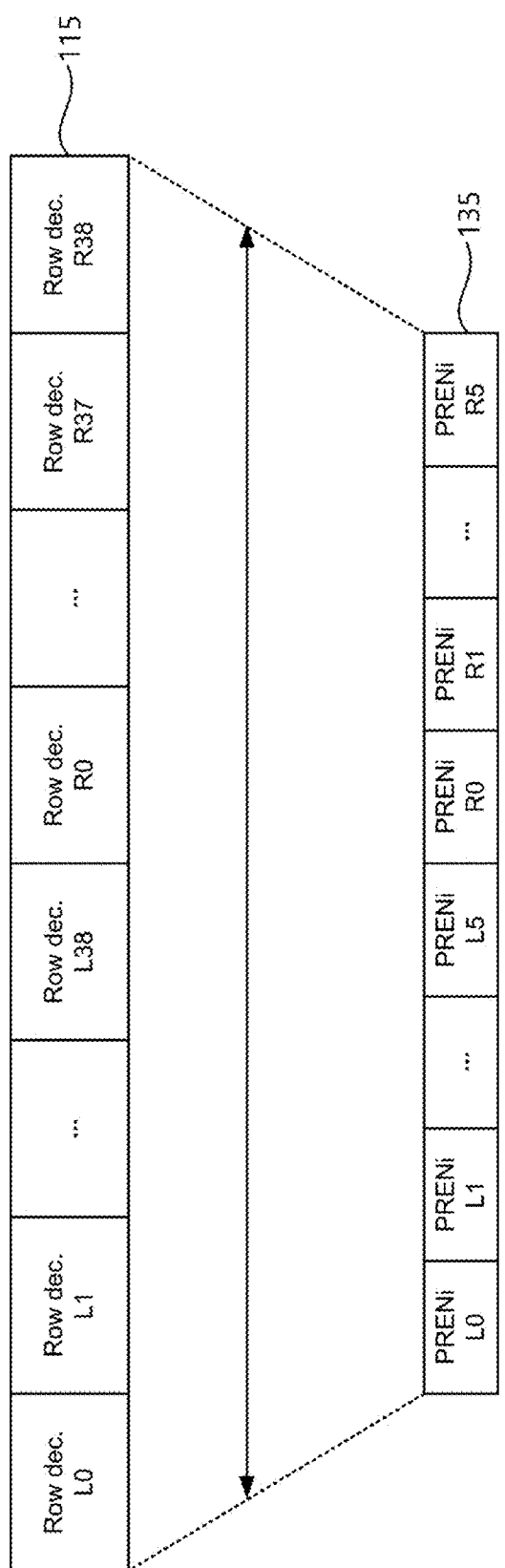
FIG. 5A is a diagram for describing an example of a flexibility according to an embodiment of the present disclosure.
Figure 5B:
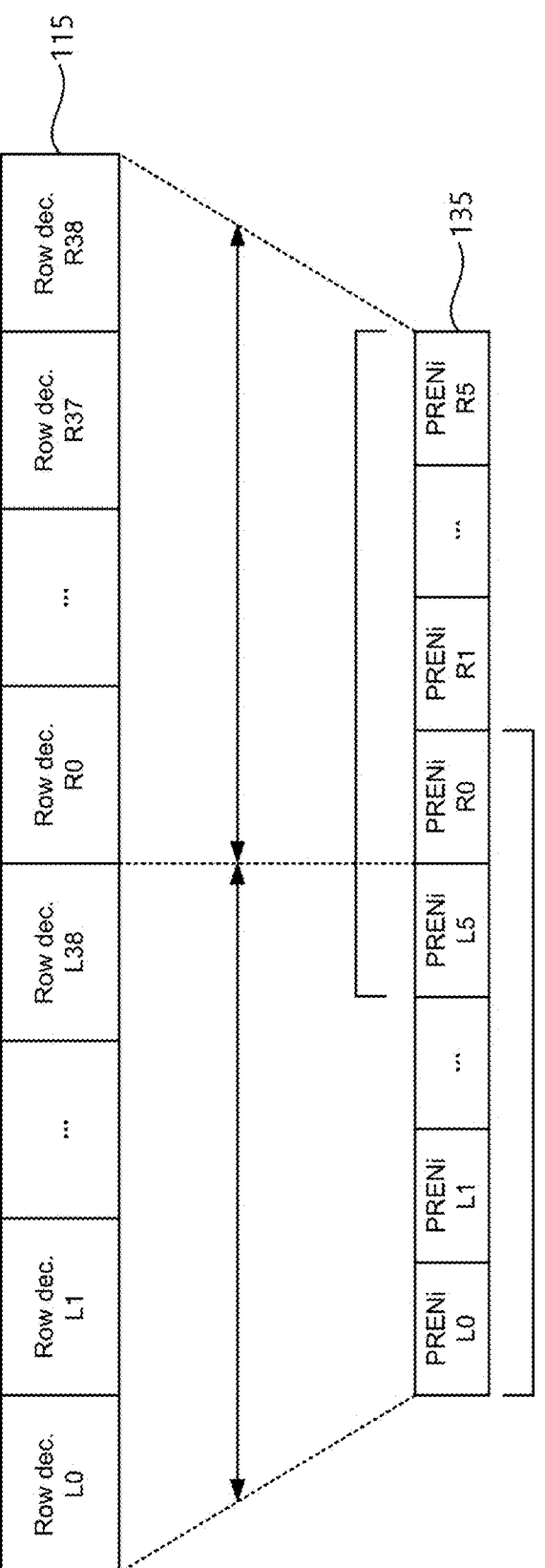
FIG. 5B is a diagram for describing an example of a flexibility according to an embodiment of the present disclosure.

FIGS. 5A and 5B are diagrams for describing examples of a flexibility according to an embodiment of the present disclosure. FIG. 5A shows an example of the full flexibility, and FIG. 5B shows an example of the half flexibility.

Referring to FIGS. 5A and 5B, the row decoder 110 may include 78 row decoder blocks 115 arranged in series from "Row dec. L0" to "Row dec. R38". Among the 78 row decoder blocks 115, "Row dec. L0" to "Row dec. L38" indicate the left half of the 78 row decoder blocks 115, and "Row dec. R0" to "Row dec. R38" indicate the right half of the 78 row decoder blocks 115. The repair control circuit 130 may include 12 repair control blocks 135 arranged in series from "PRENi L0" to "PRENi R5". "PRENi L0" to "PRENi L5" indicate the left half of the 12 repair control blocks 135, and "PRENi R0" to "PRENi R5" indicate the right half of the 12 repair control blocks 135.

Referring to FIG. 5A, in the case of the full flexibility, each of the plurality of repair control blocks 135 may take charge of all the row decoder blocks 115. That is, for example, any one of row addresses which the 78 row decoder blocks 115 take charge of may be stored in the repair control block PRENi L0 as a faulty row address. Accordingly, the repair control block PRENi L0 may transmit the control signal PRENi for the repair operation to any one of the 78 row decoder blocks 115. The above description is also applied to the remaining repair control blocks PRENi L1 to PRENi R5.

In contrast, referring to FIG. 5B, in the case of the half flexibility, the repair control blocks PRENi L0 to PRENi L5 corresponding to the left half of the plurality of repair control blocks 135 may take charge of the row decoder blocks Row dec. L0 to Row dec. L38 corresponding to the left half of the plurality of row decoder blocks 115. Also, the repair control blocks PRENi R0 to PRENi R5 corresponding to the right half of the plurality of repair control blocks 135 may take charge of the row decoder blocks Row dec. R0 to Row dec. R38 corresponding to the right half of the plurality of row decoder blocks 115.

That is, in the case of the half flexibility, row addresses which the row decoder blocks Row dec. L0 to Row dec. L38 corresponding to the left half of the plurality of row decoder blocks 115 take charge of may be only stored as a faulty row address in each of the repair control blocks PRENi L0 to PRENi L5 corresponding to the left half of the plurality of repair control blocks 135, and row addresses which the row decoder blocks Row dec. R0 to Row dec. R38 corresponding to the right half of the plurality of row decoder blocks 115 take charge of may be only stored as a faulty row address in each of the repair control blocks PRENi R0 to PRENi R5 corresponding to the right half of the plurality of repair control blocks 135. Accordingly, each of the repair control blocks PRENi L0 to PRENi L5 corresponding to the left half of the plurality of repair control blocks 135 may transmit the control signal PRENi for the repair operation only to the row decoder blocks Row dec. L0 to Row dec. L38 corresponding to the left half of the plurality of row decoder blocks 115, and each of the repair control blocks PRENi R0 to PRENi R5 corresponding to the right half of the plurality of repair control blocks 135 may transmit the control signal PRENi for the repair operation only to the row decoder blocks Row dec. R0 to Row dec. R38 corresponding to the right half of the plurality of row decoder blocks 115.

Referring to the above description, it may be understood that the length of the path through which the control signal PRENi is transferred is shorter in the case of the half flexibility than in the case of the full flexibility. That is, for example, in the case of the full flexibility, the repair control block PRENi L0 may store, as a faulty row address, row address which the row decoder blocks Row dec. L0 to Row dec. L38 corresponding to the right half of the plurality of row decoder blocks 115 take charge of, and thus, the control signal PRENi which the repair control block PRENi L0 generates may be transferred to all the row decoder blocks Row dec. L0 to Row dec. R38. However, in the case of the half flexibility, the repair control block PRENi L0 may only store, as a faulty row address, row address which the row decoder blocks Row dec. L0 to Row dec. L38 corresponding to the left half of the plurality of row decoder blocks 115 take charge of, and thus, the control signal PRENi which the repair control block PRENi L0 generates may be transferred to the row decoder blocks Row dec. L0 to Row dec. L38 and may not be transferred to the row decoder blocks Row dec. R0 to Row dec. R38 corresponding to the right half of the plurality of row decoder blocks 115.

When the length of the path through which the control signal PRENi is transferred is shortened, the amount of current consumed to transfer the control signal PRENi may be reduced. Accordingly, the current consumption amount of the memory device 100A may be smaller in the case of the half flexibility than in the case of the full flexibility.

To determine the flexibility as the half flexibility, faulty row addresses stored in the repair control blocks PRENi L0 to PRENi L5 corresponding to the left half should be included in row addresses which the row decoder blocks Row dec. L0 to Row dec. L38 corresponding to the left half take charge of, and faulty row addresses stored in the repair control blocks PRENi R0 to PRENi R5 corresponding to the right half should be included in row addresses which the row decoder blocks Row dec. R0 to Row dec. R38 corresponding to the right half take charge of.

In the case where row addresses which the row decoder blocks Row dec. R0 to Row dec. R38 corresponding to the right half take charge of may be present in faulty row addresses stored in the repair control blocks PRENi L0 to PRENi L5 corresponding to the left half or in the case where row addresses which the row decoder blocks Row dec. L0 to Row dec. L38 corresponding to the left half take charge of may be present in faulty row addresses stored in the repair control blocks PRENi R0 to PRENi R5 corresponding to the right half, the flexibility should be determined as the full flexibility for the normal repair operation.

Accordingly, according to an embodiment of the present disclosure, the fuse tracking circuit 140B may determine locations of row decoder blocks corresponding to the faulty row addresses FRAs stored in the plurality of repair control blocks 135 and may determine the flexibility.

In response to that the memory device 100B is turned on, the fuse tracking circuit 140B may receive the plurality of faulty row addresses FRAs from the repair address storage circuit 120; in this case, the plurality of faulty row addresses FRAs thus received are identical to the plurality of faulty row addresses FRAs stored in the plurality of repair control blocks 135. Accordingly, the fuse tracking circuit 140 may determine locations of row decoder blocks corresponding to the faulty row addresses FRAs stored in the plurality of repair control blocks 135, based on the plurality of faulty row addresses FRAs received from the repair address storage circuit 120.

According to an embodiment, the faulty row addresses FRAs may be sequentially transferred from the repair address storage circuit 120 and may be sequentially stored in the plurality of repair control blocks 135, respectively. In this case, the faulty row addresses FRAs may be transferred, for example, in order from lowest to highest. Accordingly, for example, referring to FIGS. 5A and 5B, the faulty row addresses FRAs may be sequentially stored in the repair control blocks PRENi L0 to PRENi R5 in order from lowest to highest. Also, according to the embodiment, row address which the plurality of row decoder blocks 115 take charge of may also be sequentially allocated in order from lowest to highest. Accordingly, for example, referring to FIGS. 5A and 5B, values of row addresses which the plurality of row decoder blocks 115 take charge of may gradually increase from "Row dec. L0" to "Row dec. R38".

Accordingly, according to an embodiment, the fuse tracking circuit 140B may determine the flexibility based on a result of determining locations of row decoder blocks corresponding to faulty row addresses stored in the repair control blocks PRENi L0 to PRENi L5 corresponding to the left half and a location of a row decoder block corresponding to a faulty row address stored in one repair control block PRENi R0 adjacent to the repair control blocks PRENi L0 to PRENi L5 corresponding to the left half from among the repair control blocks PRENi R0 to PRENi R5 corresponding to the right half. The reason is that when the faulty row address stored in the repair control block PRENi R0 corresponds to row addresses which the row decoder blocks Row dec. R0 to Row dec. R38 take charge of, faulty row addresses stored in the repair control blocks PRENi R1 to PRENI R5 may be regarded as row addresses which the row decoder blocks Row dec. R0 to Row dec. R38 take charge of.

In an embodiment, when row decoder blocks corresponding to faulty row addresses stored in the repair control blocks PRENi L0 to PRENi L5 belong to the row decoder blocks Row dec. L0 to Row dec. L38 and a row decoder block corresponding to a faulty row address stored in the repair control block PRENi R0 belongs to the row decoder blocks Row dec. R0 to Row dec. R38, the fuse tracking circuit 140B may determine the flexibility as the half flexibility. When one of row decoder blocks corresponding to faulty row addresses stored in the repair control blocks PRENi L0 to PRENi L5 belongs to the row decoder blocks Row dec. R0 to Row dec. R38 and a row decoder block corresponding to a faulty row address stored in the repair control block PRENi R0 belongs to the row decoder blocks Row dec. L0 to Row dec. L38, the fuse tracking circuit 140B may determine the flexibility as the full flexibility.

According to an embodiment, the fuse tracking circuit 140B may determine the flexibility based on a result of determining locations of row decoder blocks corresponding to faulty row addresses stored in the repair control blocks PRENi R0 to PRENi R5 corresponding to the right half and a location of a row decoder block corresponding to a faulty row address stored in one repair control block PRENi L5 adjacent to the repair control blocks PRENi R0 to PRENi R5 corresponding to the right half from among the repair control blocks PRENi L0 to PRENi L5 corresponding to the left half.

In this case, in an embodiment, when row decoder blocks corresponding to faulty row addresses stored in the repair control blocks PRENi R0 to PRENi R5 belong to the row decoder blocks Row dec. R0 to Row dec. R38 and a row decoder block corresponding to a faulty row address stored in the repair control block PRENi L5 belongs to the row decoder blocks Row dec. L0 to Row dec. L38, the fuse tracking circuit 140B may determine the flexibility as the half flexibility. When one of row decoder blocks corresponding to faulty row addresses stored in the repair control blocks PRENi R0 to PRENi R5 belongs to the row decoder blocks Row dec. L0 to Row dec. L38 and a row decoder block corresponding to a faulty row address stored in the repair control block PRENi L5 belongs to the row decoder blocks Row dec. R0 to Row dec. R38, the fuse tracking circuit 140B may determine the flexibility as the full flexibility.

According to the above description, the fuse tracking circuit 140B may determine the flexibility based on a result of determining locations of row decoder blocks corresponding to faulty row addresses stored in a given number of repair control blocks continuously disposed from one side of the plurality of repair control blocks 135.

FIG. 6 is a diagram partially illustrating address coding of a plurality of row decoder blocks according to an embodiment of the present disclosure. FIG. 6 shows three upper bits RA16, RA15, and RA14 among bits of each of row addresses which the 78 row decoder blocks 115 described with reference to FIGS. 5A and 5B take charge of. In FIG. 6, L0 to L38 indicate row decoder blocks corresponding to the left half, respectively, and R0 to R38 indicate row decoder blocks corresponding to the right half, respectively.

Referring to the above description, when it is determined whether each of row decoder blocks corresponding to specific faulty row addresses belongs to the left half of the plurality of row decoder blocks 115 or the right half of the plurality of row decoder blocks 115, one of the full flexibility and the half flexibility may be determined.

According to an embodiment of the present disclosure, a plurality of row decoder blocks may be classified into a plurality of groups depending on bit values of a given number of upper bits of each of row addresses which the plurality of row decoder blocks take charge of. For example, referring to FIG. 6, 78 row decoder blocks may be classified into 6 groups depending on bit values of three upper bits RA<16:14> of each of the row addresses which the 78 row decoder blocks take charge of. In detail, the 78 row decoder blocks may be classified into a first group L0 to L12 in which the upper bits RA<16:14> are "000", a second group L13 to L25 in which the upper bits RA<16:14> are "001", a third group L26 to L38 in which the upper bits RA<16:14> are "010", a fourth group R0 to R12 in which the upper bits RA<16:14> are "011", a fifth group R13 to R25 in which the upper bits RA<16:14> are "100", and a sixth group R26 to R38 in which the upper bits RA<16:14> are "101".

Accordingly, the fuse tracking circuit 140B may determine a location of a row decoder block corresponding to a faulty row address by determining a group, to which the row decoder block corresponding to the faulty row address belongs, from among the plurality of groups. That is, in the above example, the fuse tracking circuit 140B may determine whether a row decoder block corresponding to a faulty row address belongs to the left half of the plurality of row decoder blocks 115 or the right half of the plurality of row decoder blocks 115, by determining whether the row decoder block corresponding to the faulty row address belongs to the first to third groups or belongs to the fourth to sixth groups.

In this case, the fuse tracking circuit 140B may determine a group to which the row decoder block corresponding to the faulty row address belongs, based on a given number of upper bits of the faulty row address.

According to an embodiment, when bit values of three upper bits FRA<16:14> of the faulty row address are "000", "001", or "010", the fuse tracking circuit 140B may determine that the row decoder block corresponding to the faulty row address belongs to the first, second, or third group. Also, when the bit values of the three upper bits FRA<16:14> of the faulty row address are not "000", "001", or "010", the fuse tracking circuit 140B may determine that the row decoder block corresponding to the faulty row address belongs to the fourth, fifth, or sixth group.

In this case, when the upper bits FRA<16:14> of each of faulty row addresses stored in the repair control blocks PRENi L0 to PRENi L5 correspond to one of "000", "001", "010" and the upper bits FRA<16:14> of a faulty row address stored in the repair control block PRENi R0 does not correspond to one of "000", "001", and "010", the fuse tracking circuit 140B may determine the flexibility as the half flexibility. Also, when the upper bits FRA<16:14> of each of the faulty row addresses stored in the repair control blocks PRENi L0 to PRENi L5 do not correspond to any one of "000", "001", "010" or the upper bits FRA<16:14> of the faulty row address stored in the repair control block PRENi R0 correspond to any one of "000", "001", and "010", the fuse tracking circuit 140B may determine the flexibility as the full flexibility.

Also, according to an embodiment, when the bit values of three upper bits FRA<16:14> of the faulty row address are "011", "100", or "101", the fuse tracking circuit 140B may determine that the row decoder block corresponding to the faulty row address belongs to the fourth, fifth, or sixth group. Also, when the bit values of the three upper bits FRA<16:14> of the faulty row address are not "011", "100", or "101", the fuse tracking circuit 140B may determine that the row decoder block corresponding to the faulty row address belongs to the first, second, and third group.

In this case, when the upper bits FRA<16:14> of each of faulty row addresses stored in the repair control blocks PRENi R0 to PRENi R5 correspond to one of "011", "100", and "101" and the upper bits FRA<16:14> of a faulty row address stored in the repair control block PRENi L5 does not correspond to any one of "011", "100", and "101", the fuse tracking circuit 140B may determine the flexibility as the half flexibility. Also, when the upper bits FRA<16:14> of each of the faulty row addresses stored in the repair control blocks PRENi R0 to PRENi R5 do not correspond to any one of "011", "100", and "101" or the upper bits FRA<16:14> of the faulty row address stored in the repair control block PRENi L5 correspond to any one of "011", "100", and "101", the fuse tracking circuit 140B may determine the flexibility as the full flexibility.

Figure 7:
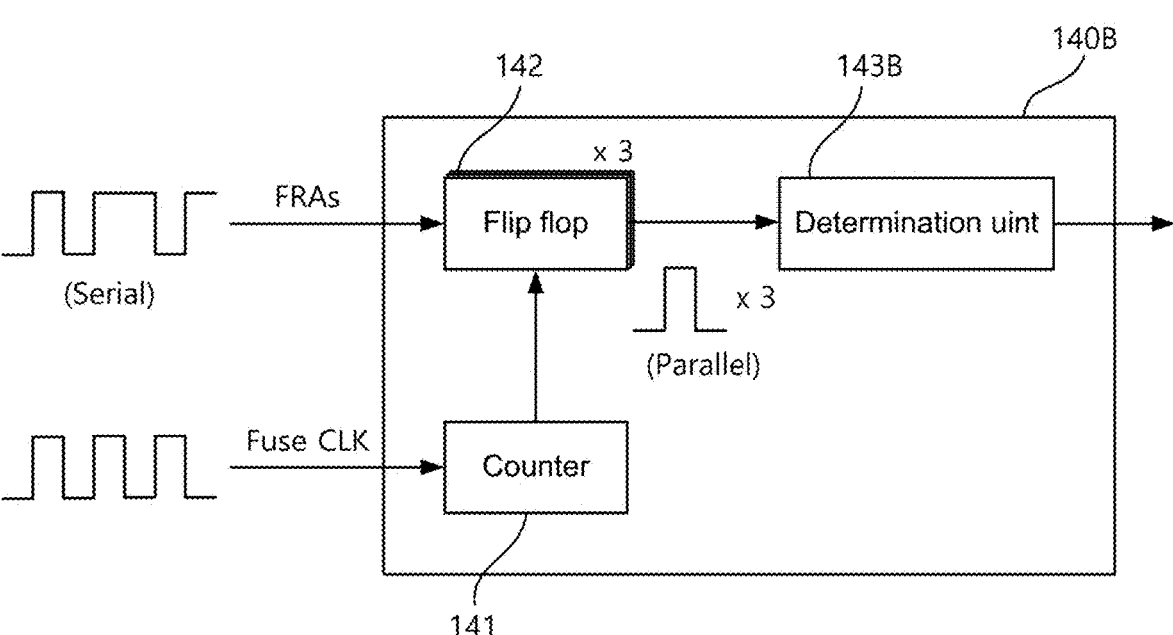
FIG. 7 is a block diagram illustrating an implementation example of a fuse tracking circuit of FIG. 4.

FIG. 7 is a block diagram illustrating an implementation example of a fuse tracking circuit of FIG. 4. Referring to FIG. 7, the fuse tracking circuit 140B may include a counter 141, a flip-flop unit 142, and a determination unit 143B. A unit is structurally composed of logic hardware configured to compute Boolean expressions, custom hardware, and/or clocked hardware such as registers.

The counter 141 is a component for identifying a given number of upper bits of each of some faulty row addresses among the plurality of faulty row addresses FRAs received in series from the repair address storage circuit 120. The counter 141 may perform a counting operation based on a clock signal Fuse CLK received from the repair address storage circuit 120. Based on the counting operation, the counter 141 may provide an identification signal to the flip-flop unit 142 at respective timings at which a given number of upper bits of each of the some faulty row addresses are applied to the flip-flop unit 142. A circuit is structurally composed of logic hardware configured to compute Boolean expressions, custom hardware, and/or clocked hardware such as registers.

The flip-flop unit 142 may receive the plurality of faulty row addresses FRAs from the repair address storage circuit 120. The flip-flop unit 142 may temporarily store a given number of upper bits of a faulty row address, based on the identification signal provided from the counter 141. In an embodiment, the flip-flop unit 142 may include flip-flops as much as the given number. Referring to the example described with reference to FIG. 6, to a group to which a row decoder block corresponding to a faulty row address belongs, bit values of three upper bits FRA<16:14> of the faulty row address are required. In this case, the flip-flop unit 142 may include three flip-flops for temporarily storing the bit values of the three upper bits FRA<16:14>.

The determination unit 143B may determine a location of a row decoder block corresponding to a faulty row address, based on a given number of bit values temporarily stored in the flip-flop unit 142. According to an embodiment, the determination unit 143B may determine a location of a relevant row decoder block, based on whether a given number of upper bits temporarily stored in the flip-flop unit 142 coincide with bit values (in the example of FIG. 6, 000, 001, 010, 011, 100, or 101) of a given number of upper bits for classifying a plurality of groups.

For example, referring to the example of FIG. 6, the determination unit 143B may determine whether a row decoder block corresponding to a relevant faulty row address belongs to the left half of the plurality of row decoder blocks 115, by determining whether a given number of upper bits temporarily stored in the flip-flop unit 142 coincide with one of "000", "001", and "010".

Also, the determination unit 143B may determine whether a row decoder block corresponding to a relevant faulty row address belongs to the right half of the plurality of row decoder blocks 115, by determining whether a given number of upper bits temporarily stored in the flip-flop unit 142 coincide with one of "011", "100", and "101".

The determination unit 143B may determine a location of each of row decoder blocks corresponding to some faulty row addresses among the faulty row addresses FRAs. In an embodiment, some faulty row addresses may include faulty row addresses stored in the repair control blocks PRENi L0 to PRENi L5 corresponding to the left half of the plurality of repair control blocks 135 and a faulty row address stored in one repair control block PRENi R0 adjacent to the repair control blocks PRENi L0 to PRENi L5 corresponding to the left half. In this case, when the upper bits FRA<16:14> of each of the faulty row addresses stored in the repair control blocks PRENi L0 to PRENi L5 correspond to one of "000", "001", and "010" and the faulty row address stored in the repair control block PRENi R0 does not correspond to one of "000", "001", and "010", the determination unit 143B may generate a control signal for determining the flexibility as the half flexibility so as to be output to the control logic 170B.

Alternatively, in an embodiment, some faulty row addresses may include faulty row addresses stored in the repair control blocks PRENi R0 to PRENi R5 corresponding to the right half of the plurality of repair control blocks 135 and a faulty row address stored in one repair control block PRENi L5 adjacent to the repair control blocks PRENi R0 to PRENi R5 corresponding to right half. In this case, when the upper bits FRA<16:14> of each of the faulty row addresses stored in the repair control blocks PRENi R0 to PRENi R5 correspond to one of "011", "100", and "101" and the faulty row address stored in the repair control block PRENi L5 does not correspond to one of "011", "100", and "101", the determination unit 143B may generate a control signal for determining the flexibility as the half flexibility so as to be output to the control logic 170B.

According to an embodiment of the present disclosure, the row decoder 110, the repair control circuit 130, and the fuse tracking circuit 140B may be provided for each bank. In this case, the flexibility may be determined independently for each bank.

As described above, because the flexibility determines a range of row decoder blocks which each repair control block takes charge of, the current consumption of the memory device 100B may vary depending on the determined flexibility. In general, the flexibility is determined by a human in an electrical die sorting (EDS) step. In detail, in the EDS step, the human checks a location of a row decoder block corresponding to a faulty row address every memory chip (i.e., memory device) and determines the flexibility of the memory chip based on the checked location.

However, according to embodiments of the present disclosure, because the flexibility is automatically determined by the fuse tracking circuit 140B, compared to the related art scheme, the test time in the EDS step may be reduced. Also, according to embodiments of the present disclosure, because the flexibility is determined in units of bank, compared to the related art scheme, current consumption may be reduced.

Below, various embodiments of the present disclosure associated with adjusting the delay amount of the active master signal PRD will be described in detail with reference to FIGS. 8 to 12.

Figure 8:
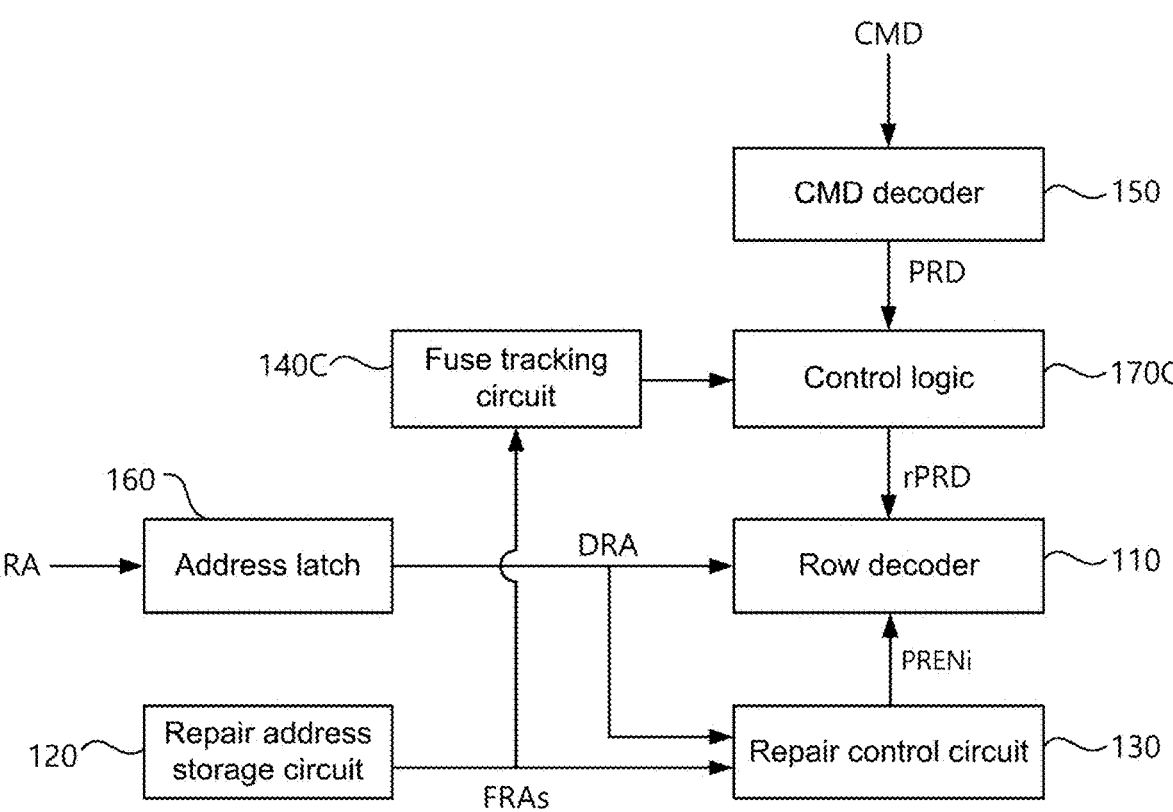
FIG. 8 is a block diagram illustrating a configuration of a memory device according to an embodiment of the present disclosure.

FIG. 8 is a block diagram illustrating a configuration of a memory device according to an embodiment of the present disclosure. A memory device 100C of FIG. 8 may be an embodiment of the memory devices 100, 100A, and 100B of FIGS. 1 to 4, but the present disclosure is not limited thereto. In describing FIG. 8, the description which is given above will be omitted or simplified.

Referring to FIG. 8, the memory device 100C may include the row decoder 110, the repair address storage circuit 120, the repair control circuit 130, a fuse tracking circuit 140C, the command decoder 150, the address latch 160, and control logic 170C.

The repair address storage circuit 120 may store the faulty row addresses FRAs and may provide the stored faulty row addresses FRAs to the repair control circuit 130 and the fuse tracking circuit 140C in response to that the memory device 100C is turned on.

The repair control circuit 130 may sequentially store the faulty row addresses FRAs received from the repair address storage circuit 120 in the plurality of repair control blocks 135, respectively.

Afterwards, when the active operation is initiated by the memory controller 500, the memory device 100C may receive the command CMD and the address ADDR from the memory controller 500. The row address RA included in the address ADDR may be applied to the row decoder 110 and the repair control circuit 130 through the address latch 160. According to an embodiment of the present disclosure, the address latch 160, the row decoder 110, the repair control circuit 130, the fuse tracking circuit 140C, and the control logic 170C may be provided for each bank.

The command decoder 150 may decode the command CMD received from the memory controller 500 to generate the active master signal PRD and may apply the generated active master signal PRD to the control logic 170C.

The control logic 170C may adjust the delay amount of the active master signal PRD under control of the fuse tracking circuit 140C. For example, the control logic 170C may receive the control signal for adjusting the delay amount of the active master signal PRD from the fuse tracking circuit 140C and may generate the active master signal rPRD whose delay amount is adjusted based on the received control signal. The control logic 170C may provide the row decoder 110 with the active master signal rPRD whose delay amount is adjusted. According to an embodiment, the control logic 170C may generate one of an active master signal with a first delay amount and an active master signal with a second delay amount smaller than the first delay amount, so as to be output to the row decoder 110.

As described above, the row decoder 110 may select a word line corresponding to the row address DRA in response to the active master signal rPRD whose delay amount is adjusted or may perform the repair operation in response to the control signal PRENi.

As described above, when the applied row address DRA coincides with the stored faulty row address, the repair control circuit 130 may generate the control signal PRENi for the repair operation and may provide the control signal PRENi to the row decoder 110.

The fuse tracking circuit 140C may determine locations of row decoder blocks corresponding to some faulty row addresses among the plurality of faulty row addresses FRAs received from the repair address storage circuit 120. In an embodiment, the some faulty row addresses may include faulty row addresses stored in a given number repair control blocks, which are disposed from a side opposing one side to which the row address DRA is applied, from among the plurality of repair control blocks 135. Also, the fuse tracking circuit 140C may provide the control logic 170C with the control signal for adjusting the delay amount of the active master signal PRD, based on the determined locations. Accordingly, the delay amount of the active master signal PRD may be adjusted.

As described above, a time taken to generate and transfer the control signal PRENi may vary depending on a location of a repair control block and a location of a row decoder block. However, in the case of a related art technology, the delay amount of the active master signal PRD may be uniformly set based on the case where the delay amount of the control signal PRENi for the repair operation is the greatest, without consideration of a location of a repair control block and a location of a row decoder block.

According to embodiments of the present disclosure, the fuse tracking circuit 140C may determine locations of row decoder blocks corresponding to faulty row addresses stored in specific repair control blocks; based on the determined locations, the fuse tracking circuit 140C may adjust the delay amount of the active master signal PRD. Accordingly, the delay amount of the active master signal PRD may be reduced except for the case where the delay amount of the control signal PRENi for the repair operation is the greatest, and thus, tRCD may be secured.

Figure 9:
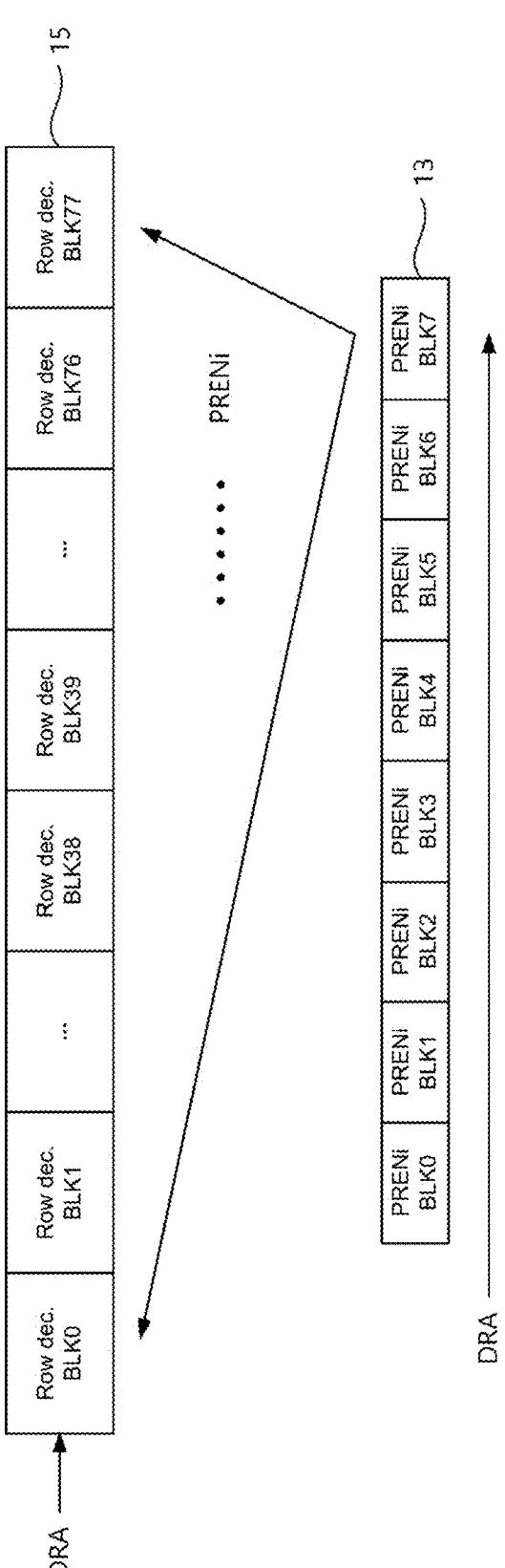
FIG. 9 is a diagram for describing a method of setting a delay amount of an active master signal in a related art technology.

FIG. 9 is a diagram for describing a method of setting a delay amount of an active master signal in a related art technology. Referring to FIG. 9, a row decoder may include 78 row decoder blocks 15 arranged in series from "Row dec. BLK0" to "Row dec. BLK77". Also, a repair control circuit may include 8 repair control blocks 13 arranged in series from "PRENi BLK0" to "PRENi BLK7".

When the active operation is initiated in a state where faulty row addresses are respectively stored in the repair control blocks 13, the row address DRA may be applied to the row decoder blocks 15 and the repair control blocks 13.

As described above, because a path through which the row address DRA is applied to each repair control block or a path through which the control signal PRENi is transferred to row decoder blocks is formed of a physical wire with parasitic components (i.e., a parasitic resistance and a parasitic capacitance), a time taken to generate and transfer the control signal PRENi may vary depending on a location of a repair control block and a location of a row decoder block.

Referring to FIG. 9, because the row address DRA is transferred in a direction from "PRENi BLK0" to "PRENi BLK7", a time when the row address DRA arrives at the repair control block PRENi BLK7 may be the longest. When the transferred row address DRA coincides with the faulty row address stored in the repair control block PRENi BLK7, the repair control block PRENi BLK7 may transfer the control signal PRENi for the repair operation to each row decoder block. In this case, because a path through which the control signal PRENi is transferred to the row decoder block Row dec. BLK0 is the longest, a time taken to transfer the control signal PRENi to the row decoder block Row dec. BLK0 is the longest. Accordingly, the case where the longest delay time is caused to generate and transfer the control signal PRENi is the case where a row decoder block corresponding to the faulty row address stored in the repair control block PRENi BLK7 is "Row dec. BLK0". In the case of a related art technology, the delay amount of the active master signal PRD (i.e., a delay time from a point in time when the active operation is initiated to a point in time when an active master signal is applied a row decoder) is set based on the above worst case.

However, as the delay amount of the active master signal PRD increases, the tRCD margin decreases. Accordingly, when the row decoder block corresponding to the faulty row address actually stored in the repair control block PRENi BLK7 is not "Row dec. BLK0", like the related art technology described above, there is no need to set the delay amount of the active master signal PRD based on the maximum delay time.

According to embodiments of the present disclosure, the fuse tracking circuit 140C may determine locations of row decoder blocks corresponding to faulty row addresses stored in specific repair control blocks. Accordingly, it may be checked whether it actually corresponds to the above worst case. Also, the fuse tracking circuit 140C may adjust a delay amount of an active master signal based on the determined locations. For example, in the case of not the above worst case, the delay amount of the active master signal may be reduced, and thus, the tRCD margin may be secured.

Figure 10B:
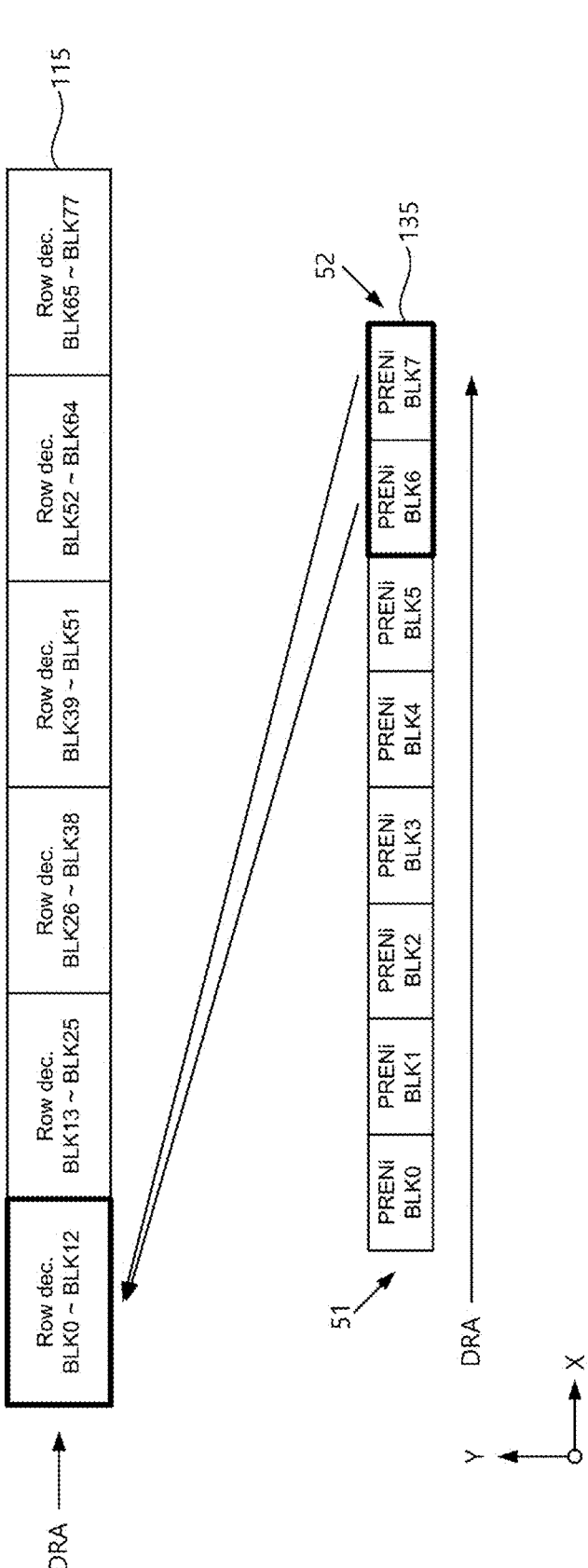
FIG. 10B is a diagram for describing a method of adjusting a delay amount of an active master signal according to an embodiment of the present disclosure.

FIGS. 10A and 10B are diagrams for describing a method of adjusting a delay amount of an active master signal according to an embodiment of the present disclosure. FIG. 10A partially shows address coding of a plurality of row decoder blocks according to an embodiment of the present disclosure. FIG. 10A shows three upper bits RA16, RA15, and RA14 among bits of each of row addresses which the 78 row decoder blocks 115 from BLK0 to BLK77 take charge of. FIG. 10B shows 78 row decoder blocks 115 classified into six groups based on the address coding described with reference to FIG. 10A and 8 repair control blocks 135 from "PRENi BLK0" to "PRENi BLK7" as an example. FIG. 10B shows the row decoder blocks 115 and the repair control blocks 135 arranged in an X-axis direction, as an example.

As described above, the fuse tracking circuit 140C may determine locations of row decoder blocks corresponding to some faulty row addresses among the plurality of faulty row addresses FRAs received from the repair address storage circuit 120. In an embodiment, the some faulty row addresses may include faulty row addresses stored in a given number of repair control blocks, at which the row address DRA arrives to be relatively late, from among the plurality of repair control blocks 135. Referring to FIG. 10B, the some faulty row addresses may include faulty row addresses stored in two repair control blocks (i.e., PRENi BLK6 and PRENi BLK7), which are continuously disposed from a side 52 opposing one side 51 to which the row address DRA is applied, from among the plurality of repair control blocks 135. In this case, the fuse tracking circuit 140C may determine locations of row decoder blocks corresponding to the faulty row addresses stored in the repair control blocks PRENi BLK6 and PRENi BLK7. However, the present disclosure is not limited thereto. For example, the number of some faulty row addresses may be variously changed depending on the number of repair control blocks 135, a length of a path through which the row address DRA is applied, etc.

In this case, for example, the fuse tracking circuit 140C may determine a location of a row decoder block corresponding to a faulty row address by determining a group, to which the row decoder block corresponding to the faulty row address belongs, from among a plurality of groups classified as illustrated in FIG. 10B.

Referring to FIGS. 10A and 10B, 78 row decoder blocks may be classified into 6 groups depending on bit values of three upper bits RA<16:14> of each of row addresses which the 78 row decoder blocks take charge of. In detail, the 78 row decoder blocks may be classified into a first group Row dec. BLK0 to Row dec. BLK12 in which the upper bits RA<16:14> are "000", a second group Row dec. BLK13 to Row dec. BLK25 in which the upper bits RA<16:14> are "001", a third group Row dec. BLK26 to Row dec. BLK38 in which the upper bits RA<16:14> are "010", a fourth group Row dec. BLK39 to Row dec. BLK51 in which the upper bits RA<16:14> are "011", a fifth group Row dec. BLK52 to Row dec. BLK64 in which the upper bits RA<16:14> are "100", and a sixth group Row dec. BLK65 to Row dec. BLK77 in which the upper bits RA<16:14> are "101".

In this case, according to an embodiment, the fuse tracking circuit 140C may determine a location of a row decoder block corresponding to a faulty row address by determining whether the row decoder block corresponding to the faulty row address belongs to a specific group among the first to sixth groups.

For example, the fuse tracking circuit 140C may determine whether row decoder blocks corresponding to the some faulty row addresses belong to the first group from one of opposite sides of the plurality of groups. In this case, the one side which is used as a criterion for determining the first group may be one side, to which the row address DRA is applied, from among the opposite sides of the plurality of repair control blocks 135.

Referring to FIG. 10B, the row address DRA is applied at the left side among the opposite sides of the plurality of repair control blocks 135. In this case, the fuse tracking circuit 140C may determine whether row decoder blocks corresponding to faulty row addresses stored in the two repair control blocks PRENi BLK6 and PRENi BLK7 continuously disposed from the right side among the opposite sides of the repair control blocks 135 belongs to the first group from the left side of the plurality of groups (i.e., belongs to Group 1 of Row dec. BLK0 to Row dec. BLK12). In the example of FIG. 10B, assuming that the row address DRA is applied at the right side among the opposite sides of the plurality of repair control blocks 135, the fuse tracking circuit 140C may determine whether row decoder blocks corresponding to faulty row addresses stored in two repair control blocks PRENi BLK0 and PRENi BLK1 continuously disposed from the left side among the opposite sides of the repair control blocks 135 belongs to the first group from the right side of the plurality of groups (i.e., belongs to Group 6 of Row dec. BLK65 to Row dec. BLK77).

In this case, the fuse tracking circuit 140C may determine whether a row decoder block corresponding to a faulty row address belongs to a specific group, based on a given number of upper bits of the faulty row address.

Referring to FIGS. 10A and 10B, the fuse tracking circuit 140C may determine whether a row decoder block corresponding to a faulty row address belongs to the first group, based on whether bit values of three upper bits FRA<16:14> of the faulty row address are "000". Also, the fuse tracking circuit 140C may determine whether the row decoder block corresponding to the faulty row address belongs to the sixth group, based on whether the bit values of the three upper bits FRA<16:14> of the faulty row address are "101".

In the example illustrated in FIG. 10B, the case where row decoder blocks corresponding to the faulty row addresses stored in the repair control blocks PRENi BLK6 and PRENi BLK7 belong to the first group corresponds to the worst case where the delay amount of the control signal PRENi is the greatest. Accordingly, in this case, the fuse tracking circuit 140C may determine whether the delay amount of the control signal PRENi corresponds to the worst case, by determining whether the row decoder blocks corresponding to the faulty row addresses stored in the repair control blocks PRENi BLK6 and PRENi BLK7 belong to the first group.

Also, in an embodiment where the row address DRA is applied at the right side, the case where row decoder blocks corresponding to faulty row addresses stored in the repair control blocks PRENi BLK0 and PRENi BLK1 belong to the sixth group corresponds to the worst case where the delay amount of the control signal PRENi is the greatest. Accordingly, in this case, the fuse tracking circuit 140C may determine whether the delay amount of the control signal PRENi corresponds to the worst case, by determining whether the row decoder blocks corresponding to the faulty row addresses stored in the repair control blocks PRENi BLK0 and PRENi BLK1 belong to the sixth group.

The fuse tracking circuit 140C may generate a control signal for adjusting the delay amount of the active master signal PRD based on the determined locations of the row decoder blocks and may control the control logic 170C through the generated control signal to adjust the delay amount of the active master signal PRD.

For example, in the example illustrated in FIG. 10B, when the row decoder blocks corresponding to the faulty row addresses stored in the repair control blocks PRENi BLK6 and PRENi BLK7 belong to the first group, the fuse tracking circuit 140C may control the control logic 170C such that an active master signal with a first delay amount is output. Also, when the row decoder blocks corresponding to the faulty row addresses stored in the repair control blocks PRENi BLK6 and PRENi BLK7 do not belong to the first group, the fuse tracking circuit 140C may control the control logic 170C such that an active master signal with a second delay amount smaller than the first delay amount is output.

In the embodiment where the row address DRA is applied at the right side, when the row decoder blocks corresponding to the faulty row addresses stored in the repair control blocks PRENi BLK0 and PRENi BLK1 belong to the sixth group, the fuse tracking circuit 140C may control the control logic 170C such that the active master signal with the first delay amount is output. Also, when the row decoder blocks corresponding to the faulty row addresses stored in the repair control blocks PRENi BLK0 and PRENi BLK1 do not belong to the sixth group, the fuse tracking circuit 140C may control the control logic 170C such that the active master signal with the second delay amount smaller than the first delay amount is output.

Figure 11:
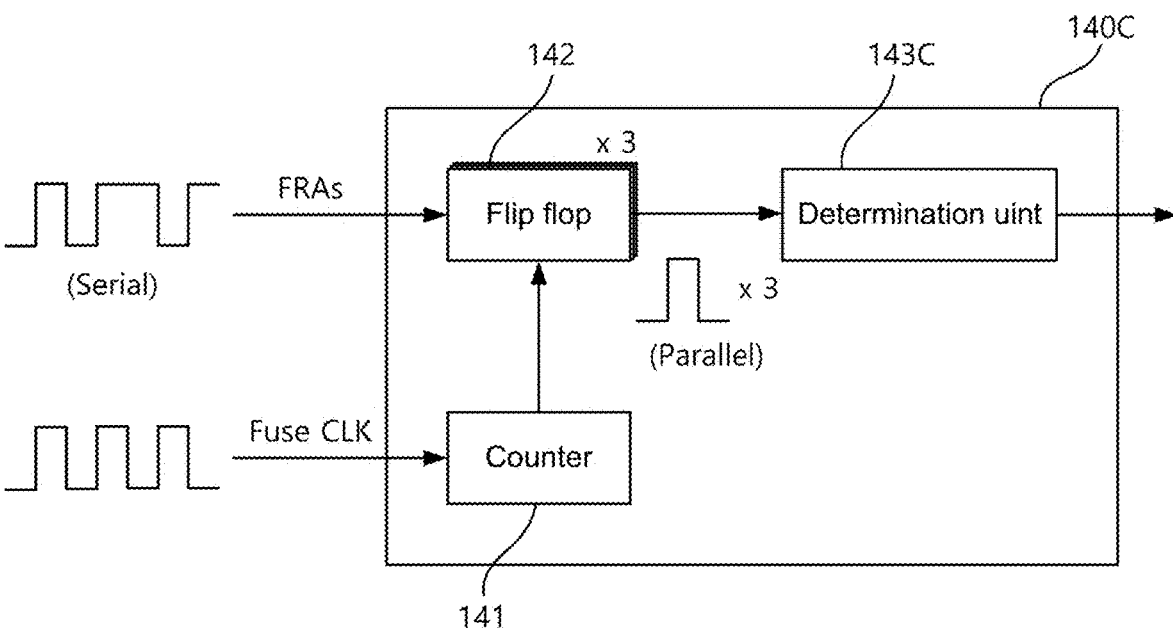
FIG. 11 is a block diagram illustrating an implementation example of a fuse tracking circuit of FIG. 8.

FIG. 11 is a block diagram illustrating an implementation example of a fuse tracking circuit of FIG. 8. Referring to FIG. 11, the fuse tracking circuit 140C may include the counter 141, the flip-flop unit 142, and a determination unit 143C. In describing FIG. 11, the description which is given above will be omitted or simplified.

Based on the clock signal Fuse CLK, the counter 141 may provide the identification signal to the flip-flop unit 142 at respective timings at which a given number of upper bits of each of some faulty row addresses among the plurality of faulty row addresses FRAs are applied to the flip-flop unit 142.

The flip-flop unit 142 may temporarily store a given number of upper bits of a faulty row address, based on the identification signal provided from the counter 141. In an embodiment, the flip-flop unit 142 may include flip-flops as much as the given number.

The determination unit 143C may determine a location of a row decoder block corresponding to a faulty row address, based on a given number of bit values temporarily stored in the flip-flop unit 142. According to an embodiment, the determination unit 143C may determine a location of a relevant row decoder block, based on whether a given number of upper bits temporarily stored in the flip-flop unit 142 coincide with bit values (in the example of FIG. 10A, 000, 001, 010, 011, 100, or 101) of a given number of upper bits for classifying a plurality of groups.

For example, referring to the examples of FIGS. 10A and 10B, the determination unit 143C may determine whether a row decoder block corresponding to a relevant faulty row address belongs to the first group, by determining whether a given number of upper bits temporarily stored in the flip-flop unit 142 coincide with "000". Alternatively, the determination unit 143C may determine whether a row decoder block corresponding to a relevant faulty row address belongs to the sixth group, by determining whether a given number of upper bits temporarily stored in the flip-flop unit 142 coincide with "101".

The determination unit 143C may determine a location of each of row decoder blocks corresponding to some faulty row addresses among the faulty row addresses FRAs. In this case, the some faulty row addresses may include faulty row addresses stored in a given number repair control blocks, which are continuously disposed from a side opposing one side to which the row address DRA is applied, from among the plurality of repair control blocks 135.

The determination unit 143C may generate a control signal for adjusting the delay amount of the active master signal PRD based on the locations of the row decoder blocks determined as described above and may provide the generated control signal to the control logic 170C.

According to an embodiment of the present disclosure, the row decoder 110, the repair control circuit 130, and the fuse tracking circuit 140C may be provided for each bank. In this case, the delay amount of the active master signal PRD may be adjusted independently for each bank.

Figure 12:
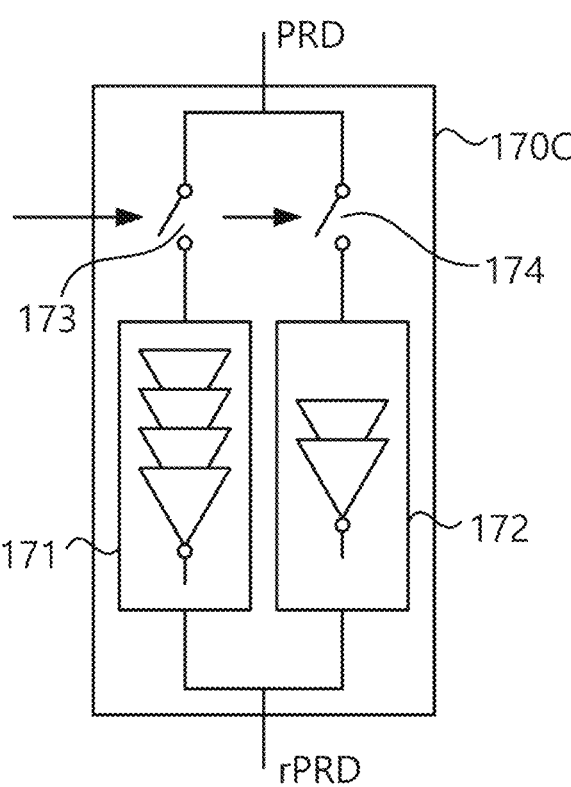
FIG. 12 is a block diagram illustrating an implementation example of control logic of FIG. 8.

FIG. 12 is a block diagram illustrating an implementation example of control logic of FIG. 8. Referring to FIG. 12, the control logic 170C may include a first delay unit 171, a second delay unit 172, a first switch 173, and a second switch 174.

The first delay unit 171 may delay and output an applied signal as much as the first delay amount. According to an embodiment, the first delay amount may correspond to a delay time calculated under the assumption of the worst case (i.e., the above worst case) where the delay amount of the control signal PRENi for the repair operation is the greatest, but the present disclosure is not limited thereto. The second delay unit 172 may delay and output an applied signal as much as the second delay amount smaller than the first delay amount. To this end, the number of delay cells included in the first delay unit 171 may be different from the number of delay cells included in the second delay unit 172.

The first switch 173 may be turned on/off based on a control signal applied from the fuse tracking circuit 140C; in the turned-on state, the first switch 173 may apply the active master signal PRD to the first delay unit 171.

The second switch 174 may be turned on/off based on a control signal applied from the fuse tracking circuit 140C; in the turned-on state, the second switch 174 may apply the active master signal PRD to the second delay unit 172.

For example, when a control signal for adjusting the delay amount of the active master signal PRD as much as the first delay amount is received from the fuse tracking circuit 140C, the first switch 173 may be turned on. When the active master signal PRD is applied to the first delay unit 171, the first delay unit 171 may output the active master signal rPRD whose delay time is adjusted as much as the first delay amount.

Also, when a control signal for adjusting the delay amount of the active master signal PRD as much as the second delay amount is received from the fuse tracking circuit 140C, the second switch 174 may be turned on. When the active master signal PRD is applied to the second delay unit 172, the second delay unit 172 may output the active master signal rPRD whose delay time is adjusted as much as the second delay amount.

The case where the control logic 170C includes two delay units 171 and 172 respectively having the first and second delay amounts is described above, but an embodiment is not limited thereto. For example, the control logic 170C may include three or more delay units having different delay amounts. In this case, the fuse tracking circuit 140C may additionally determine a location of a row decoder block corresponding to a faulty row address stored in any other repair control block different from that described above or may output an additional control signal by applying any other condition even though it is determined that a location of a row decoder block corresponds to a faulty row address stored in the repair control block described above. Accordingly, the delay amount of the active master signal PRD may be adjusted more finely.

The embodiments associated with adjusting a delay amount of an active master signal under the assumption of the case where the flexibility is determined as the full flexibility are described with reference to FIGS. 8 to 12, but the present disclosure is not limited thereto. For example, even though the degree to which the tRCD margin is secured somewhat low compared to the full flexibility, the embodiments described with reference to FIGS. 8 to 12 may also be applied to the case where the flexibility is determined as the half flexibility.

Figure 13:
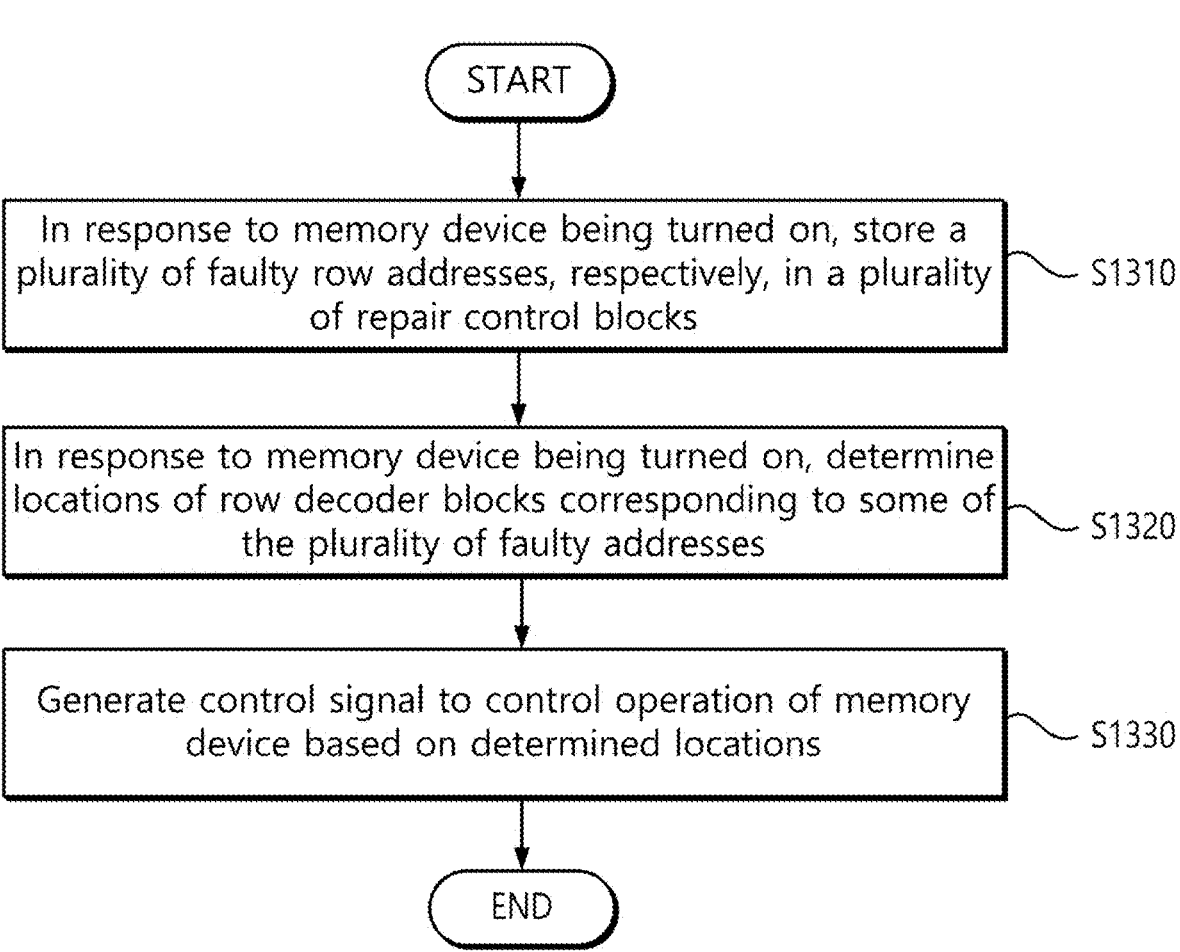
FIG. 13 is a flowchart illustrating an operating method of a memory device according to an embodiment of the present disclosure.

FIG. 13 is a flowchart illustrating an operating method of a memory device according to an embodiment of the present disclosure. In describing FIG. 13, the description which is given above will be omitted.

Referring to FIG. 13, in operation S1310, in response to that the memory device 100/100A/100B/100C is turned on, the memory device 100/100A/100B/100C may store the plurality of faulty row addresses FRAs in the plurality of repair control blocks 135.

Also, in operation S1320, in response to that the memory device 100/100A/100B/100C is turned on, the memory device 100/100A/100B/100C may determine locations of row decoder blocks corresponding to some faulty row addresses among the plurality of faulty row addresses FRAs. In this case, the some faulty row addresses may include faulty row addresses stored in a given number of repair control blocks continuously disposed from one side of the plurality of repair control blocks 135.

According to an embodiment, the plurality of row decoder blocks 115 may be classified into a plurality of groups depending on bit values of a given number of upper bits of each of row addresses which the plurality of row decoder blocks 115 take charge of. Accordingly, the memory device 100/100A/100B/100C may determine locations of row decoder blocks corresponding to the some faulty row address by determining groups, to which the row decoder blocks corresponding to the some faulty row address belong, from among the plurality of groups.

In this case, the memory device 100/100A/100B/100C may determine groups to which the row decoder blocks corresponding to the some faulty row addresses belong, by determining whether a given number of upper bits of each of the some faulty row addresses coincide with some of bit values of a given number of upper bits for distinguishing the plurality of groups.

In operation S1330, the memory device 100/100A/100B/100C may generate a control signal for controlling the operation of the memory device 100/100A/100B/100C based on the locations determined in operation S1320. According to an embodiment, the memory device 100/100A/100B/100C may generate a control signal for determining the flexibility being a range of row decoder blocks, which each repair control block takes charge of, based on the locations determined in operation S1320. Also, according to an embodiment, the memory device 100/100A/100B/100C may generate a control signal for determining a delay amount of an active master signal, based on the locations determined in operation S1320.

The embodiments of determining a location of a row decoder block corresponding to a faulty row address and controlling an operation of the row decoder 110 based on the determined location are described above, but an embodiment of utilizing a faulty row address is not limited thereto. For example, a delay amount which is caused when the row address DRA is applied to the repair control blocks 135 may vary depending on the numbers of 1s and 0s included in faulty row addresses. Accordingly, according to an embodiment of the present disclosure, the fuse tracking circuit 140/140B/140C may count the numbers of 1s and 0s included in bits constituting the faulty row addresses FRAs and may adjust the delay amount of the active master signal PRD depending on the ratio of the counted number of 1s and the counted number of 0s.

Also, the embodiments where an operation of a row decoder is controlled by utilizing faulty row addresses in association with a row-based repair operation are described above. However, embodiments of the present disclosure are not limited thereto. For example, the memory device 100/100A/100B/100C may perform the repair operation in units of column depending on an embodiment. In this case, faulty column addresses may be stored in the repair address storage circuit 120. Accordingly, in response to that the memory device 100/100A/100B/100C is turned on, the fuse tracking circuit 140/140B/140C may receive faulty column addresses from the repair address storage circuit 120 and may control various kinds of operations of a column decoder associated with the column-based repair operation by utilizing the received faulty column addresses.

According to the above embodiments of the present disclosure, the performance of a memory device may be improved by utilizing faulty address information.

While certain embodiments of the present disclosure have been described and shown, it will be apparent to those of ordinary skill in the art that various changes and modifications may be made thereto without departing from the spirit and scope of the present disclosure as set forth in the following claims.

What is claimed is:

1. A memory device comprising:
a row decoder comprising a plurality of row decoder blocks arranged in series, wherein the plurality of row decoder blocks are distinguished based on row addresses which the plurality of row decoder blocks take charge of;
a repair address storage circuit comprising a fuse array in which a first plurality of faulty row addresses are stored;
a repair control circuit comprising a plurality of repair control blocks arranged in series to correspond to the plurality of row decoder blocks; and
a fuse tracking circuit configured to determine locations of row decoder blocks corresponding to a second plurality of faulty row addresses among the first plurality of faulty row addresses received from the repair address storage circuit and to control an operation of the row decoder based on the locations.

2. The memory device of claim 1, wherein the second plurality of faulty row addresses comprise faulty row addresses stored in a given number of repair control blocks continuously disposed from one side of the plurality of repair control blocks.

3. The memory device of claim 1, wherein the repair control circuit is configured to sequentially store the first plurality of faulty row addresses received from the repair address storage circuit in the plurality of repair control blocks, respectively, based on the memory device being turned on, and
wherein, based on a row address received through an active operation coinciding with a stored faulty row address, each of the plurality of repair control blocks is configured to provide a control signal for a repair operation to the row decoder.

4. The memory device of claim 1, wherein the fuse tracking circuit is further configured to:
based on the memory device being turned on, receive the first plurality of faulty row addresses from the repair address storage circuit; and
determine the locations of the row decoder blocks corresponding to the second plurality of faulty row addresses.

5. The memory device of claim 1, wherein the plurality of row decoder blocks are classified into a first plurality of groups depending on bit values of a given number of upper bits of the row addresses, wherein the fuse tracking circuit is further configured to determine the locations of the row decoder blocks corresponding to the second plurality of faulty row addresses by determining a second plurality of groups among the first plurality of groups, and
wherein the second plurality of groups comprises the row decoder blocks corresponding to the second plurality of faulty row addresses.

6. The memory device of claim 5, wherein the fuse tracking circuit is further configured to determine the second plurality of groups based on the given number of upper bits of the second plurality of faulty row addresses.

7. The memory device of claim 6, wherein the fuse tracking circuit comprises:
a counter configured to identify the given number of upper bits of the second plurality of faulty row addresses;
a flip-flop unit configured to temporarily store first bits based on a counter output; and
a determination unit configured to:
determine the locations of the row decoder blocks corresponding to the second plurality of faulty row addresses, based on whether first values of the first bits temporarily stored in the flip-flop unit coincide with second values of second bits corresponding to the given number of upper bits for classifying the first plurality of groups, and
output a control signal for controlling the operation of the row decoder based on the locations.

8. The memory device of claim 1, wherein the fuse tracking circuit is further configured to output a first control signal for determining a flexibility being a range of row decoder blocks which each of the plurality of repair control blocks takes charge of, and
wherein the row decoder is configured to operate based on the flexibility.

9. The memory device of claim 8, wherein the first control signal indicates:
a full flexibility in which each of the plurality of repair control blocks takes charge of all the row decoder blocks, or
a half flexibility in which first repair control blocks included in a first-side half from among the plurality of repair control blocks take charge of first row decoder blocks included in the first-side half from among the plurality of row decoder blocks and second repair control blocks included in a second-side half from among the plurality of repair control blocks take charge of second row decoder blocks included in the second-side half from among the plurality of row decoder blocks.

10. The memory device of claim 9, further comprising first control logic configured to select one of a first path for operating with the full flexibility or a second path for operating with the half flexibility based on the first control signal.

11. The memory device of claim 9, wherein the plurality of row decoder blocks are classified into a plurality of groups depending on bit values of a given number of upper bits of the row addresses,
wherein the plurality of groups comprises a first plurality of groups comprising the first row decoder blocks and a second plurality of groups comprising the second row decoder blocks, and
wherein the fuse tracking circuit is further configured to, based on row decoder blocks corresponding to faulty row addresses stored in the first repair control blocks belonging to the first plurality of groups and a second row decoder block corresponding to a faulty row address stored in a repair control block adjacent to the first repair control blocks, from among the second repair control blocks, belonging to the second plurality of groups, output the first control signal for determining the flexibility as the half flexibility.

12. The memory device of claim 8, wherein a memory cell array of the memory device comprises a plurality of banks, wherein the row decoder, the repair control circuit, and the fuse tracking circuit are provided for each of the plurality of banks, and wherein the flexibility is determined independently for each of the plurality of banks.

13. The memory device of claim 1, wherein the fuse tracking circuit is further configured to output a second control signal indicating an adjusted delay amount with respect to an active master signal, based on the locations, and wherein the row decoder is configured to operate based on the active master signal with the adjusted delay amount.

14. The memory device of claim 13, further comprising second control logic configured to output one of the active master signal with a first delay amount or the active master signal with a second delay amount smaller than the first delay amount to the row decoder, based on the second control signal.

15. The memory device of claim 14, wherein the plurality of row decoder blocks are classified into a plurality of groups depending on bit values of a given number of upper bits of the row addresses, wherein the plurality of repair control blocks are provided with a row address from a first side among opposite sides in an active operation, wherein the second plurality of faulty row addresses comprises a third plurality of faulty row addresses stored in a given number of repair control blocks continuously disposed from a second side opposing the first side, among the opposite sides of the plurality of repair control blocks, wherein the fuse tracking circuit is further configured to, based on second row decoder blocks corresponding to the second plurality of faulty row addresses belonging to a group first disposed from the first side from among the plurality of groups, control the second control logic such that the active master signal with the first delay amount is output, and wherein the fuse tracking circuit is further configured to, based on the second row decoder blocks corresponding to the second plurality of faulty row addresses not belonging to the group first disposed from the first side from among the plurality of groups, control the second control logic such that the active master signal with the second delay amount is output.

16. A method of a memory device which comprises a plurality of row decoder blocks distinguished based on row addresses which the plurality of row decoder blocks take charge of, the method comprising:

based on the memory device being turned on, storing a first plurality of faulty row addresses in a plurality of repair control blocks, respectively;

based on the memory device being turned on, determining locations of row decoder blocks corresponding to a second plurality of faulty row addresses among the first plurality of faulty row addresses; and generating a control signal for controlling an operation of the memory device based on the locations, wherein the second plurality of faulty row addresses comprises a third plurality of faulty row addresses stored in a given number of repair control blocks continuously disposed from one side of the plurality of repair control blocks.

17. The method of claim 16, wherein the plurality of row decoder blocks are classified into a first plurality of groups depending on bit values of a given number of upper bits of the row addresses, and wherein the determining the locations comprises determining a second plurality of groups among the first plurality of groups, to which the row decoder blocks corresponding to the second plurality of faulty row addresses belong.

18. The method of claim 17, wherein the determining the second plurality of groups comprises determining whether first values of the given number of upper bits of the second plurality of faulty row addresses coincide with second values of corresponding upper bits for classifying the first plurality of groups.

19. The method of claim 16, wherein the control signal is for determining a flexibility being a range of row decoder blocks which each of the plurality of repair control blocks takes charge or is for adjusting a delay amount of an active master signal.

20. A memory device comprising:

a fuse array configured to store a faulty row address;

a plurality of row decoder blocks respectively corresponding to a plurality of memory cell blocks; and a fuse tracking circuit configured to determine a location of a row decoder block corresponding to the faulty row address from among the plurality of row decoder blocks and to generate a control signal for controlling an operation of the memory device based on the location.

* * * * *